US009772518B2

(12) United States Patent
Ito

(10) Patent No.: US 9,772,518 B2
(45) Date of Patent: Sep. 26, 2017

(54) ELECTRO-OPTICAL DEVICE AND ELECTRONIC APPARATUS

(71) Applicant: Seiko Epson Corporation, Tokyo (JP)

(72) Inventor: Satoshi Ito, Eniwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/134,295

(22) Filed: Apr. 20, 2016

(65) Prior Publication Data

US 2016/0377910 A1 Dec. 29, 2016

(30) Foreign Application Priority Data

Jun. 25, 2015 (JP) .................................. 2015-003203

(51) Int. Cl.
| | | |
|---|---|---|
| H01L 21/00 | (2006.01) | |
| G02F 1/1333 | (2006.01) | |
| H01L 27/12 | (2006.01) | |
| G02F 1/1343 | (2006.01) | |
| G02F 1/1362 | (2006.01) | |
| G02F 1/1339 | (2006.01) | |

(52) U.S. Cl.
CPC .. *G02F 1/133345* (2013.01); *G02F 1/134309* (2013.01); *G02F 1/136227* (2013.01); *H01L 27/1237* (2013.01); *G02F 1/1339* (2013.01); *G02F 1/13392* (2013.01); *G02F 2001/13629* (2013.01); *G02F 2001/136281* (2013.01); *G02F 2001/136295* (2013.01)

(58) Field of Classification Search
CPC ......... G02F 1/133345; G02F 1/134309; H01L 27/1237
See application file for complete search history.

(56) References Cited

U.S. PATENT DOCUMENTS

| 9,075,276 B2* | 7/2015 | Tateno | G02F 1/136213 |
|---|---|---|---|
| 9,110,325 B2* | 8/2015 | Ito | G02F 1/133345 |
| 9,529,220 B2* | 12/2016 | Ito | G02F 1/133345 |
| 2005/0174495 A1* | 8/2005 | Itoh | G02B 13/0095 |
| | | | 348/758 |
| 2013/0021542 A1* | 1/2013 | Ito | G02F 1/133345 |
| | | | 349/5 |
| 2013/0021555 A1* | 1/2013 | Tateno | G02F 1/136213 |
| | | | 349/61 |

(Continued)

FOREIGN PATENT DOCUMENTS

| JP | 2004-363300 A | 12/2004 |
|---|---|---|
| JP | 2007-310152 A | 11/2007 |
| JP | 2013-025069 A | 2/2013 |

*Primary Examiner* — Laura Menz
(74) *Attorney, Agent, or Firm* — ALG Intellectual Property, LLC

(57) ABSTRACT

In an electro-optical device, a relay electrode (first electrode) includes a conduction section that overlaps the projection portion of an inter-layer insulation film, and the conduction section is exposed from the surface (flat surface) of the inter-layer insulation film. An insulation film which has a film thickness thinner than the height of the projection portion is formed on the surface (flat surface) of the inter-layer insulation film, and a pixel electrode is electrically conducted to the conduction section through the opening of the insulation film. In this case, since the opening is shallow, a large uneven part is hardly generated on the surface of the pixel electrode.

9 Claims, 18 Drawing Sheets

(56) References Cited

U.S. PATENT DOCUMENTS

| | | | |
|---|---|---|---|
| 2015/0293395 A1* | 10/2015 | Tateno | G02F 1/136213 349/61 |
| 2015/0323828 A1* | 11/2015 | Ito | G02F 1/133345 349/5 |
| 2016/0377903 A1* | 12/2016 | Ito | G02F 1/13439 349/5 |
| 2016/0377910 A1* | 12/2016 | Ito | G02F 1/133345 257/72 |

* cited by examiner

FIG. 6
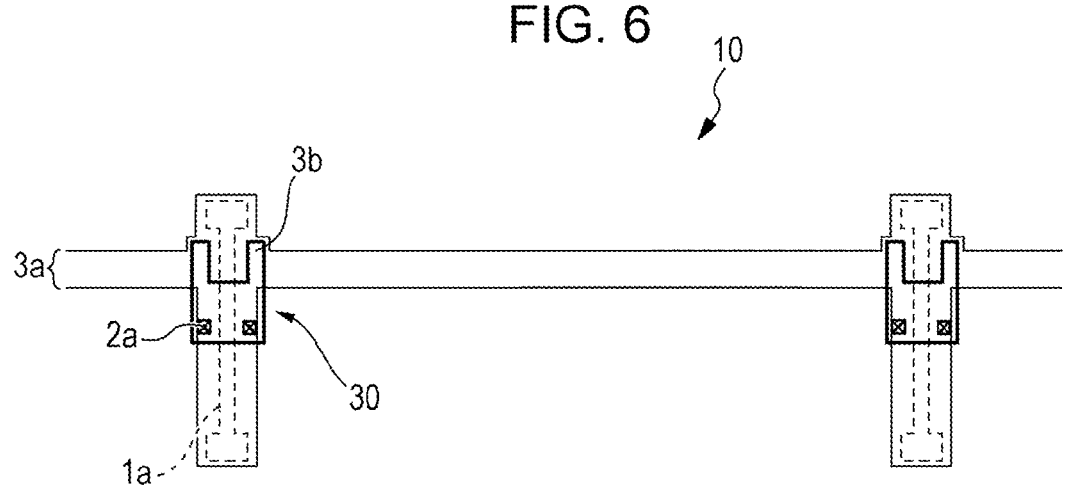
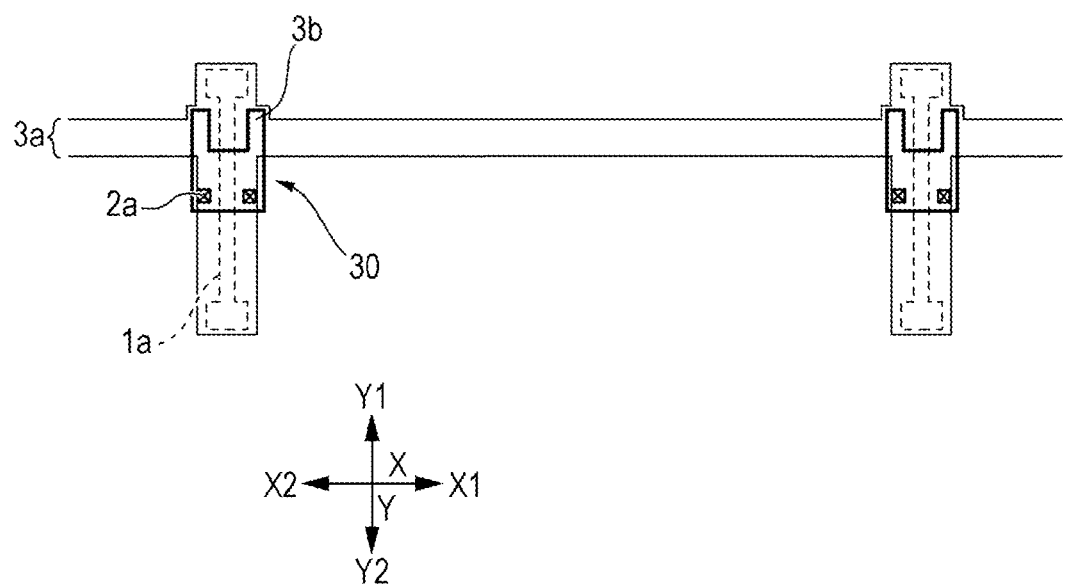

FIG. 11
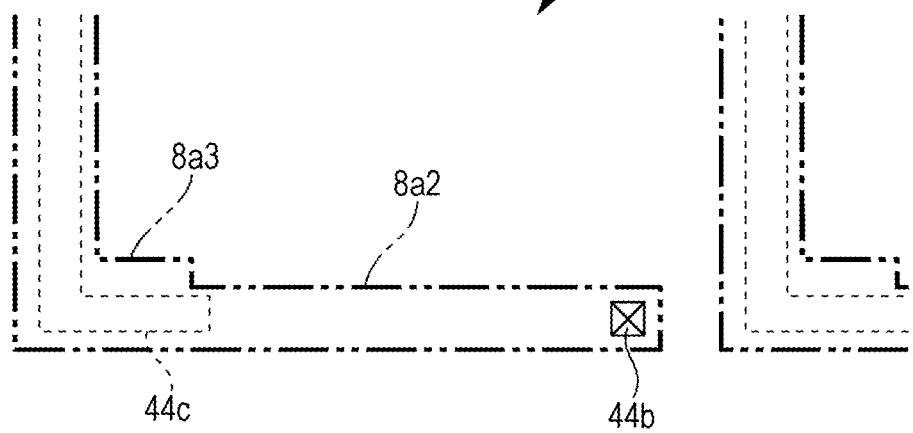
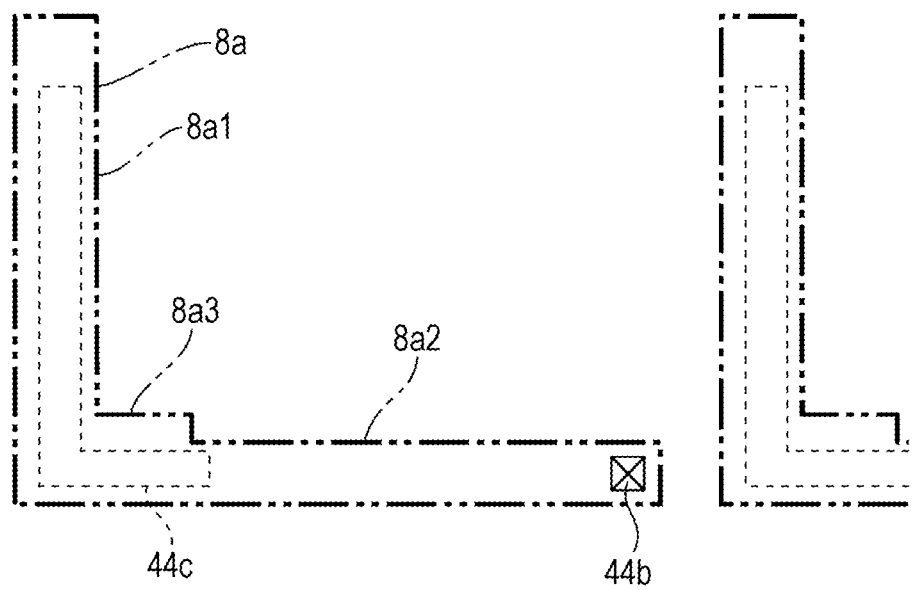
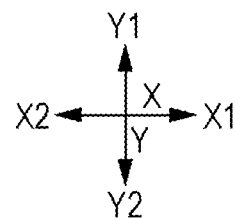

ELECTRO-OPTICAL DEVICE AND ELECTRONIC APPARATUS

BACKGROUND

1. Technical Field

The present invention relates to an electro-optical device, in which a first electrode is electrically conducted to a second electrode through an insulation film, and an electronic apparatus.

2. Related Art

In an element substrate which is used for an electro-optical device such as a liquid crystal apparatus, a pixel electrode is electrically conducted to a conductive layer on a lower layer side through a contact hole which is formed in an inter-layer insulation film. When the planar size of the contact hole is large and a large uneven part is formed on the surface of the pixel electrode in the electro-optical device, the quality of display is lowered due to the reason that is difficult to suitably form an oriented film. Here, a configuration is proposed in which a plug is embedded into the contact hole of the inter-layer insulation film and the pixel electrode is electrically conducted to the electrode on the lower layer side through the plug. However, when the plug is formed, it is necessary to newly prepare a metallic material, such as tungsten, which is not generally used in the electro-optical device, and thus costs increase. In addition, when a conduction structure due to the plug is used, it is necessary to perform sputter deposition on the metal film for the plug to be thick until the contact hole is embedded, productivity is lowered.

Here, a configuration is proposed in which a conductive layer (first electrode) that includes a conduction section which overlaps the tip end surface of a projection portion in planar view and an insulation film that includes a flat surface which exposes the conduction section on the side of the pixel electrode (second electrode) are provided, and the pixel electrode is laminated on the flat surface of the insulation film to be conducted to the conduction section (refer to JP-A-2013-25069).

However, in the configuration disclosed in JP-A-2013-25069, it is necessary to perform a planarization process on the insulation film such that the conduction section is exposed, and thus it is difficult to cause the insulation film to have another function. For example, the film thickness of the insulation film becomes thick, and thus it is difficult to use the insulation film as a dielectric layer for adjusting a refractive index in order to suppress the dispersion of the wavelength of the light which passes through the pixel electrode. In addition, if the insulation film is formed of boron-doped silicate glass and is used as a protective film, the film thickness of the boron-doped silicate glass easily varies when a film is formed, and thus the efficiency of the planarization process is lowered.

SUMMARY

An advantage of some aspects of the invention is to provide an electro-optical device and an electronic apparatus which are capable of increasing the degree of freedom for a configuration of a surface on which a second electrode is formed, even in a case of a structure in which the second electrode is electrically conducted to a first electrode which is exposed from the flat surface of an insulation film.

According to an aspect of the invention, there is provided an electro-optical device including: a substrate; a projection portion that protrudes on a side opposite to the substrate on one surface side of the substrate; a first electrode that includes a part which overlaps a tip end surface of the projection portion; a first insulation film that is formed on the side opposite to the substrate for the first electrode, and includes a flat surface on the side opposite to the substrate; a second insulation film that is formed to have a film thickness thinner than the height of the projection portion on the side opposite to the substrate for the first insulation film; and a second electrode that is formed on the side opposite to the substrate for the second insulation film; in which the first electrode is electrically conducted to the second electrode at a part, which overlaps the tip end surface of the projection portion in planar view, through a part at which the first insulation film and the second insulation film are open.

According to the aspect of the invention, a part of the first electrode overlaps the projection portion, and the second electrode comes into contact with a part which is exposed from the surface (flat surface) of the first insulation film of the first electrode. In addition, the second insulation film, which has the film thickness thinner than the height of the projection portion, is formed on the surface (flat surface) of the first insulation film, and the second electrode electrically conducted to the first electrode through the opening of the second insulation film. Therefore, a planarization process for forming the flat surface in order to expose the conduction section is not performed on the second insulation film, and thus the degree of freedom is high for the material of the second insulation film and the configuration of the film thickness or the like. Even in the case, the film thickness of the second insulation film is thin, and thus the opening is shallow. Accordingly, a large uneven part is hardly generated on the surface of the second electrode.

According to the aspect of the invention, for example, the electro-optical device further includes a pixel transistor between the substrate and the first electrode, and the second electrode is a pixel electrode, and the first electrode is a relay electrode which is electrically connected to the pixel transistor. Here, it is possible to form the second insulation film of boron-doped silicate glass or the like, and to use a protective film for moisture. In addition, when the film thickness and the refractive index of the second insulation film are adjusted, the second insulation film can suppress wavelength dispersion of the light which passes through the pixel electrode by a lamination film of the second insulation film and the pixel electrode.

According to the aspect of the invention, it is possible to use a state in which the second insulation film includes the boron-doped silicate glass.

According to the aspect of the invention, it is possible to use a state in which the pixel electrode includes, at least, a first transparent conductive film, which is laminated on the side opposite to the substrate, of the second insulation film, and a refractive index adjusting dielectric film, which is laminated on the side opposite to the substrate, of the first transparent conductive film. Here, it is possible to suppress the wavelength dispersion of the light which passes through the pixel electrode.

According to the aspect of the invention, it is possible to use a state in which the pixel electrode further includes a second transparent conductive film, which is laminated on the side opposite to the substrate, of the refractive index adjusting dielectric film. Here, it is possible to suppress the wavelength dispersion of the light which passes through the pixel electrode.

According to the aspect of the invention, it is preferable that the electro-optical device further includes a light shading layer that is provided between the substrate and the pixel electrode and is configured to define a transparent area of the pixel electrode, and the pixel electrode includes a connection section that electrically connects the first transparent conductive film to the second transparent conductive film in a location which overlaps the light shading layer in planar view. Here, it is possible to apply a potential, which is the same as that of the first transparent conductive film, to the second transparent conductive film. Therefore, it is not necessary to apply a high drive voltage to the pixel electrode, and thus it is possible to perform proper driving. In addition, the connection section is provided in an area which overlaps light shading layer in planar view, and thus a situation, in which the connection section reduces the amount of light that passes through the pixel electrode, does not easily occur.

According to the aspect of the invention, it is possible to use a state in which the connection section is a part at which the first transparent conductive film and the second transparent conductive film project from an end portion of the refractive index adjusting dielectric film and come into contact with each other. Here, the connection section is provided at end portion of the pixel electrode, and thus it is easy to provide the connection section in the area which overlaps the light shading layer in planar view.

According to the aspect of the invention, it is preferable that the first transparent conductive film and the second transparent conductive film are formed to be the same shape. Here, it is possible to continuously pattern the first transparent conductive film and the second transparent conductive film, and thus it is possible to increase productivity.

According to the aspect of the invention, it is preferable that the connection section is provided to surround a periphery of the refractive index adjusting dielectric film. Here, it is possible to reduce the electrical resistance of the whole pixel electrode.

According to the aspect of the invention, it is possible to use a state in which the electro-optical device further includes a capacity electrode which is provided to overlap the relay electrode in planar view, and to which a constant potential is applied; and a dielectric layer which is laminated between the first electrode and the capacity electrode.

In this case, it is possible to use a state in which the projection portion overlaps the capacity electrode in planar view. Here, it is possible to use the thickness or the like of the capacity electrode to form the shape of the projection portion.

In the electro-optical device according to the aspect of the invention, it is possible to use various display apparatuses, such as a direct-viewing type display apparatus, in various electronic apparatuses. In addition, it is possible to use the electro-optical device to which the invention is applied as a projection-type display apparatus. The projection-type display apparatus includes a light source section that emits illumination light which is irradiated into the electro-optical device to which the invention is applied; and a projection optical system that projects light which is modulated by the electro-optical device.

BRIEF DESCRIPTION OF THE DRAWINGS

The invention will be described with reference to the accompanying drawings, wherein like numbers reference like elements.

FIG. 6 is a plan view of a pixel transistor illustrated in FIGS. 3 and 4.

FIG. 11 is a plan view of a relay electrode illustrated in FIGS. 3 and 4.

DESCRIPTION OF EXEMPLARY EMBODIMENTS

Figure 1:
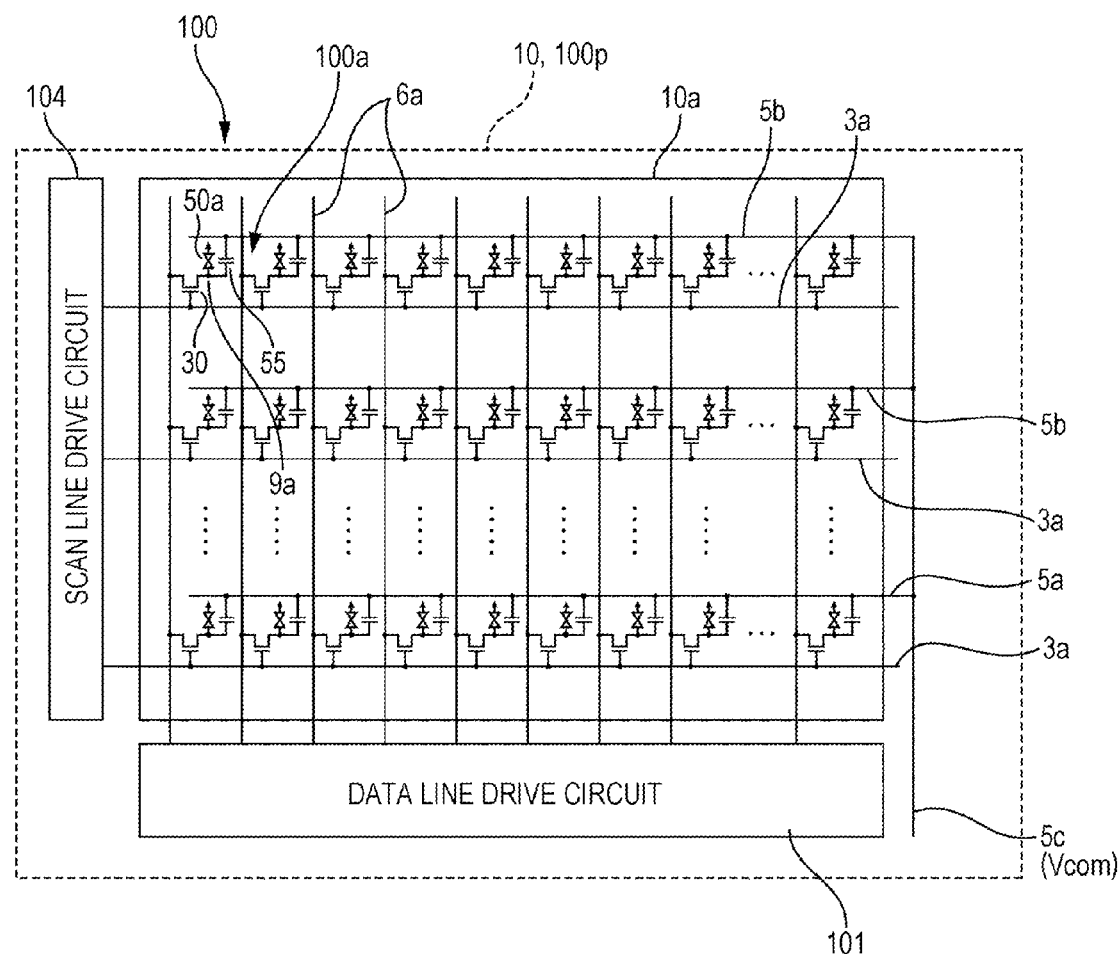
FIG. 1 is a block diagram illustrating an aspect of an electrical configuration of an electro-optical device to which the invention is applied.

An embodiment of the invention will be described with reference to the accompanying drawings. Meanwhile, in the drawings which are referred to below, each layer and each member are shown in sizes which can be recognized on the drawing, and thus the scales thereof are different for each layer and each member. In addition, when a driving method of reversing the direction of current which flows through a pixel transistor is used, a source and a drain are replaced. However, in the description below, a side to which a pixel electrode is connected (pixel side source-drain region) is set to a drain, and a side to which a data line is connected (data line side source-drain region) is set to a source. In addition, when a layer which is formed on a first substrate is described, an upper layer side or a surface side means a side (side on which a second substrate is located) opposite to a side on which the substrate main body of the first substrate is located, and a lower layer side means a side (side opposite to a side on which the second substrate is located) on which the substrate main body of the first substrate is located.

Description of Electro-Optical Device (Liquid Crystal Apparatus)

Whole Configuration

FIG. 1 is a block diagram illustrating an aspect of an electrical configuration of an electro-optical device to which the invention is applied. Meanwhile, FIG. 1 is a block diagram illustrating only the electrical configuration. Therefore, a layout, such as a direction in which a capacity electrode or the like extends, is schematically illustrated.

In FIG. 1, an electro-optical device 100 (liquid crystal apparatus) of the embodiment includes a liquid crystal panel 100p in a Twisted Nematic (TN) mode or a Vertical Alignment (VA) mode, and the liquid crystal panel 100p includes an image display area 10a (pixel area) in which a plurality of pixels 100a are arranged in a matrix shape at the central area thereof. In the liquid crystal panel 100p, a plurality of data lines 5a and a plurality of scan lines 3a extend in longitudinal and lateral directions on a first substrate 10 (refer to FIG. 2), which will be described later, inside the image display area 10a, and the pixels 100a are formed in the locations corresponding to the intersections thereof. In each of the plurality of pixels 100a, a pixel transistor 30, which includes a field effect transistor or the like, and a pixel electrode 9a, which will be described later, are formed. The data line 5a is electrically connected to the source of the pixel transistor 30, the scan line 3a is electrically connected to the gate of the pixel transistor 30, and the pixel electrode 9a is electrically connected to the drain of the pixel transistor 30.

In the first substrate 10, a scan line drive circuit 104 and a data line drive circuit 101 are provided on the outer circumferential side of the image display area 10a. The data line drive circuit 101 is electrically connected to each of the data lines 5a, and sequentially supplies an image signal, which is supplied from the image processing circuit, to each of the data lines 5a. The scan line drive circuit 104 is electrically connected to each of the scan lines 3a, and sequentially supplies a scan signal to each of the scan lines 3a.

In each pixel 100a, the pixel electrode 9a faces a common electrode formed on a second substrate 20 (refer to FIG. 2), which will be described later, through a liquid crystal layer, and forms a liquid crystal capacity 50a. A maintenance capacity 55 is added to each pixel 100a in parallel to the liquid crystal capacity 50a in order to prevent variation in an image signal which is maintained in the liquid crystal capacity 50a. In the embodiment, in order to form the maintenance capacity 55, a capacity line 6a, to which a constant potential (common potential) is applied, is provided, and the capacity line 6a is electrically conducted to a constant potential line 5c.

Configuration of Liquid Crystal Panel 100p

Figure 2:
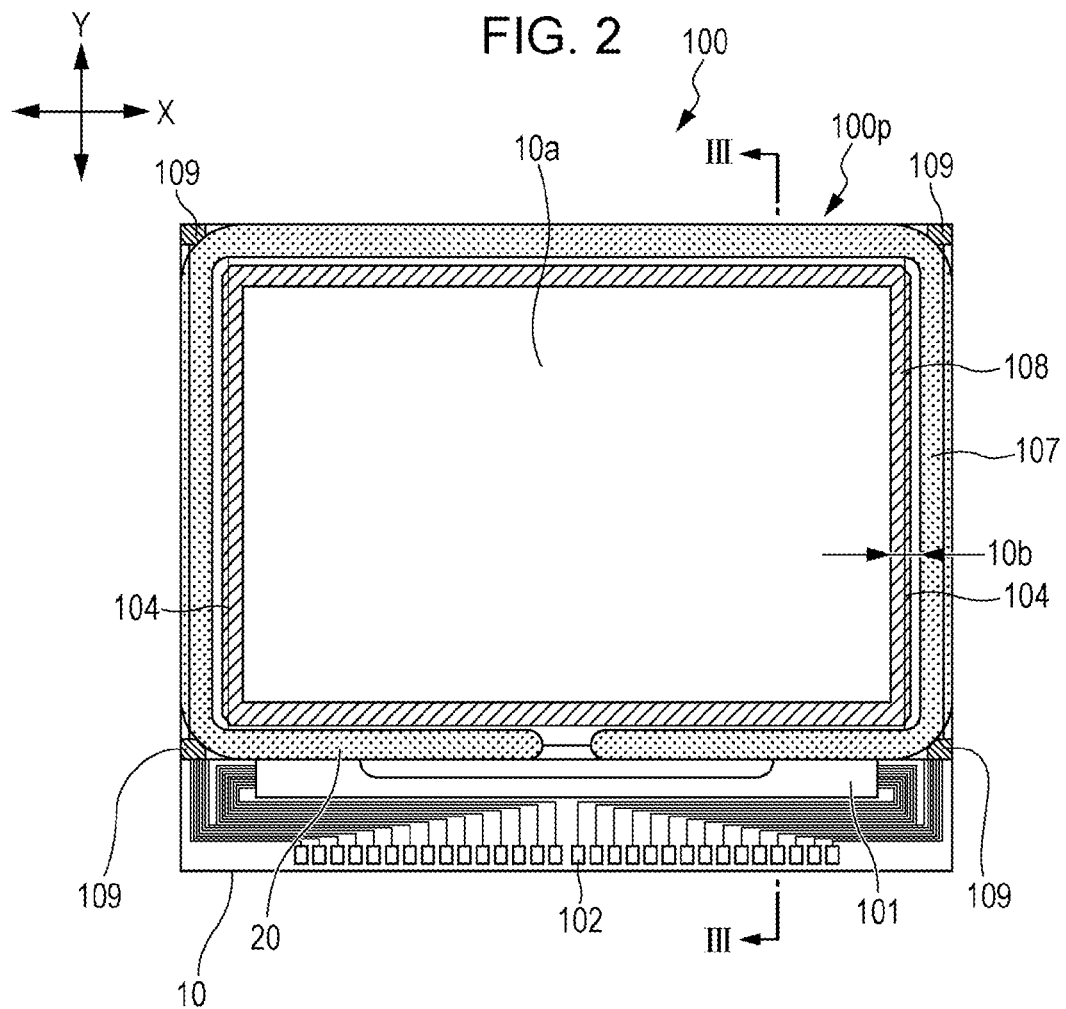
FIG. 2 is a plan view illustrating an aspect of a liquid crystal panel using the electro-optical device to which the invention is applied.
Figure 3:
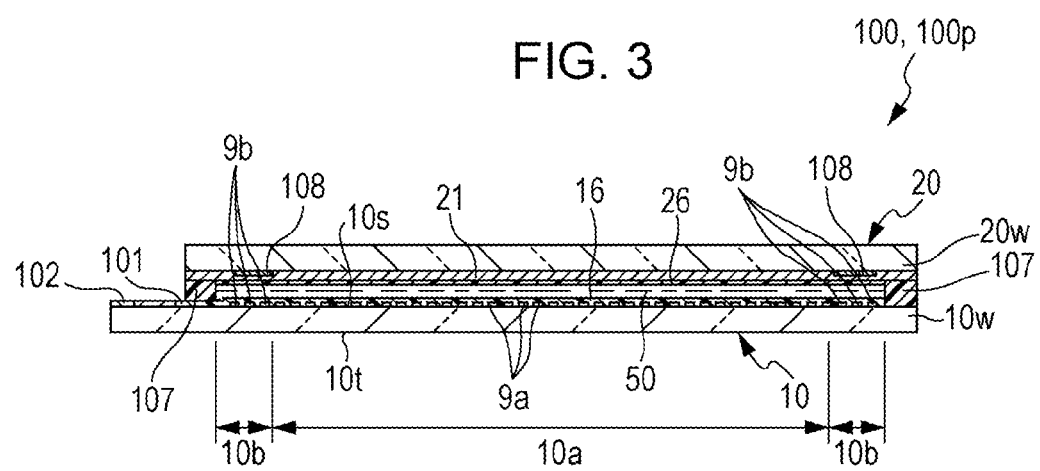
FIG. 3 is a sectional view of the liquid crystal panel illustrated in FIG. 2.

FIG. 2 is a plan view illustrating an aspect of the liquid crystal panel 100p using the electro-optical device 100 to which the invention is applied. FIG. 3 is a sectional view (III-III sectional view) of the liquid crystal panel 100p illustrated in FIG. 2.

As illustrated in FIGS. 2 and 3, in the liquid crystal panel 100p, the first substrate 10 and the second substrate 20 are bonded by a seal material 107 through a predetermined gap, and the seal material 107 is provided in a frame shape along the outer edge of the second substrate 20. The seal material 107 is an adhesive, which is formed of a photo curable resin or a thermosetting resin, and gap materials, such as glass fibers or glass beads, are combined in order to set the distance between both the substrates to a predetermined value.

In the liquid crystal panel 100p of the embodiment, both the first substrate 10 and second substrate 20 have a square shape, and the image display area 10a, which is described with reference to FIG. 1, is provided approximately at the center of the liquid crystal panel 100p as a square-shaped area. The seal material 107 is also provide approximately in a square shape so as to correspond to the shapes of the substrates, and an approximately square-shaped peripheral area 10b is provided in a frame shape between the inner periphery of the seal material 107 and the outer periphery of the image display area 10a. In the first substrate 10, the data line drive circuit 101 and a plurality of terminals 102 are formed along one edge of the first substrate 10 on the outer side of the image display area 10a, and the scan line drive circuit 104 is formed along the other edge which is adjacent to the one edge. Meanwhile, a flexible wiring substrate (not shown in the drawing) is connected to the terminals 102, and various potentials and various signals are input to the first substrate 10 through the flexible wiring substrate.

Although details will be described later, in one side surface 10s and the other side surface 10t of the first substrate 10, the pixel transistors 30, which are described with reference to FIG. 1, and the pixel electrodes 9a, which are electrically connected to the pixel transistors 30, are formed in a matrix shape in the image display area 10a on the side of the one side surface 10s. An oriented film 16 is formed on the upper layer sides of the pixel electrodes 9a. On the one side surface 10s of the first substrate 10, dummy pixel electrodes 9b, which are simultaneously formed with the pixel electrodes 9a, are formed in the peripheral area 10b.

A common electrode 21 is formed on one surface side of the second substrate 20, which faces the first substrate 10, and an oriented film 26 is formed on the surface of the side of the first substrate 10 of the common electrode 21. The common electrode 21 is formed on approximately the entire surface of the second substrate 20. On one surface side of the second substrate 20, which faces the first substrate 10, a light shading layer 108 is formed on the lower layer side of the common electrode 21. In the embodiment, the light shading layer 108 is formed in a frame shape which extends along the outer periphery of the image display area 10a, and functions as a boundary. The outer periphery of the light shading layer 108 is present in a location with a gap between the inner periphery of the seal material 107, and the light shading layer 108 does not overlap the seal material 107. Meanwhile, there is a case in which, in the second substrate 20, the light shading layer 108 is formed as a black matrix section in an area which overlaps the inter-pixel area interposed by adjacent pixel electrodes 9a. In addition, there is a case in which the second substrate 20 is formed as a lens array substrate on which lenses (micro lenses) facing the plurality of respective pixel electrodes 9a are formed.

In the first substrate 10 of the liquid crystal panel 100p, inter-substrate conduction electrodes 109 are formed in areas, which overlap the corner parts of the second substrate 20 on the outer side than the seal material 107, in order to take electrical conduction between the first substrate 10 and the second substrate 20. In the inter-substrate conduction electrodes 109, inter-substrate conduction materials 109a, which include conductive particles, are arranged. The common electrode 21 of the second substrate 20 is electrically connected to the side of the first substrate 10 through the inter-substrate conduction materials 109a and the inter-substrate conduction electrodes 109. Therefore, common potential is applied to the common electrode 21 from the side of the first substrate 10. The seal material 107 has approximately the same width dimension, and is provided along the outer periphery of the second substrate 20. Therefore, the seal material 107 has an approximately square shape. However, in the areas, which overlap the corner parts of the second substrate 20, the seal material 107 is provided to pass thereinside while avoiding the inter-substrate conduction electrodes 109, and the corner parts of the seal material 107 have approximately arc shapes.

In the electro-optical device 100, when the pixel electrode 9a and the common electrode 21 are formed of a transparent conductive film, such as Indium Tin Oxide (ITO) or Indium Zinc Oxide (IZO), it is possible to form a transmission-type liquid crystal apparatus. In contrast, when the common electrode 21 is formed of the transparent conductive film and the pixel electrode 9a is formed of a reflective conductive film, such as aluminum, it is possible to form a reflection-type liquid crystal apparatus. In a case in which the electro-optical device 100 is reflection type, an image is displayed in such a way that light which is incident from the side of the second substrate 20 is modulated during a time when light is reflected in the substrate on the side of the first substrate 10 and is emitted. In a case in which the electro-optical device 100 is a transmission type, an image is displayed in such a way that light, which is incident from one of the first substrate 10 and the second substrate 20, is modulated during a time when light passes through and is reflected in the other side substrate. In the embodiment, the electro-optical device 100 is formed as a transmission-type liquid crystal apparatus.

It is possible to use the electro-optical device 100 as the color display apparatus of an electronic apparatus, such as a mobile computer or a mobile phone. In this case, a color filter (not shown in the drawing) and a protective film are formed on the second substrate 20. In addition, in the electro-optical device 100, a phase-difference film, a polarizing plate, and the like are arranged for the liquid crystal panel 100p in a predetermined direction according to the kind of a liquid crystal layer 50 to be used or normal white mode/normal black mode. Further, it is possible to use the electro-optical device 100 as RGB light valves in the projection-type display apparatus (liquid crystal projector) which will be described later. In this case, respective color lights, which are separated through RGB color separation dichroic mirrors, are incident into the respective RGB electro-optical devices 100 as projection lights, and thus color filters are not formed.

In the embodiment, a case, in which the electro-optical device 100 is a transmission-type liquid crystal apparatus that is used as the RGB light valves in the projection-type display apparatus which will be described later, and light which is incident from the second substrate 20 is emitted after passing through the first substrate 10, will be mainly described. In addition, in the embodiment, a case in which the electro-optical device 100 includes the liquid crystal panel 100p in a VA mode in which a nematic liquid crystal compound having negative dielectric anisotropy is used as the liquid crystal layer 50, will be mainly described.

Detailed Configuration of Pixel

Figure 4:
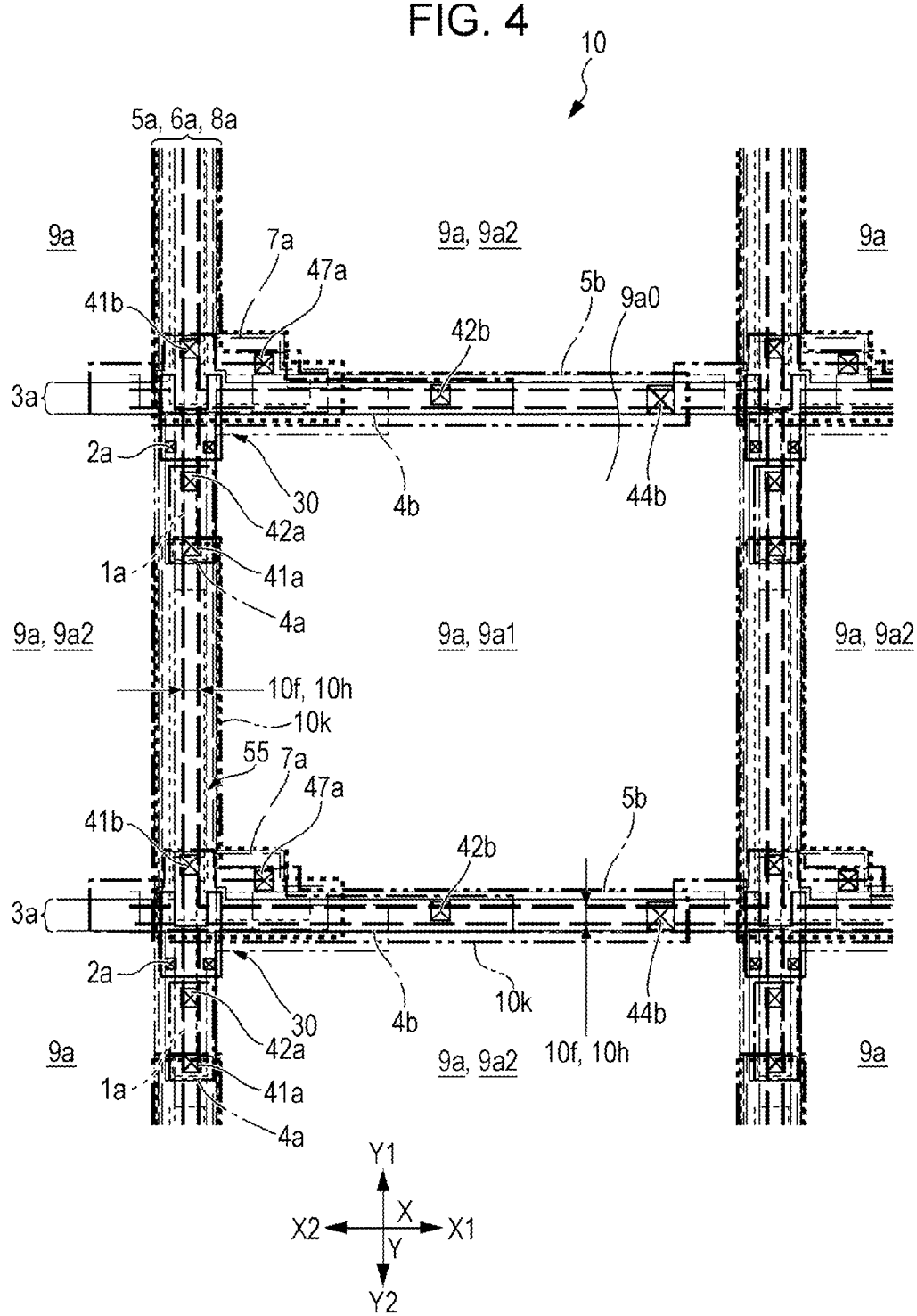
FIG. 4 is a plan view illustrating an aspect of adjacent pixels in the first substrate of the electro-optical device to which the invention is applied.
Figure 5:
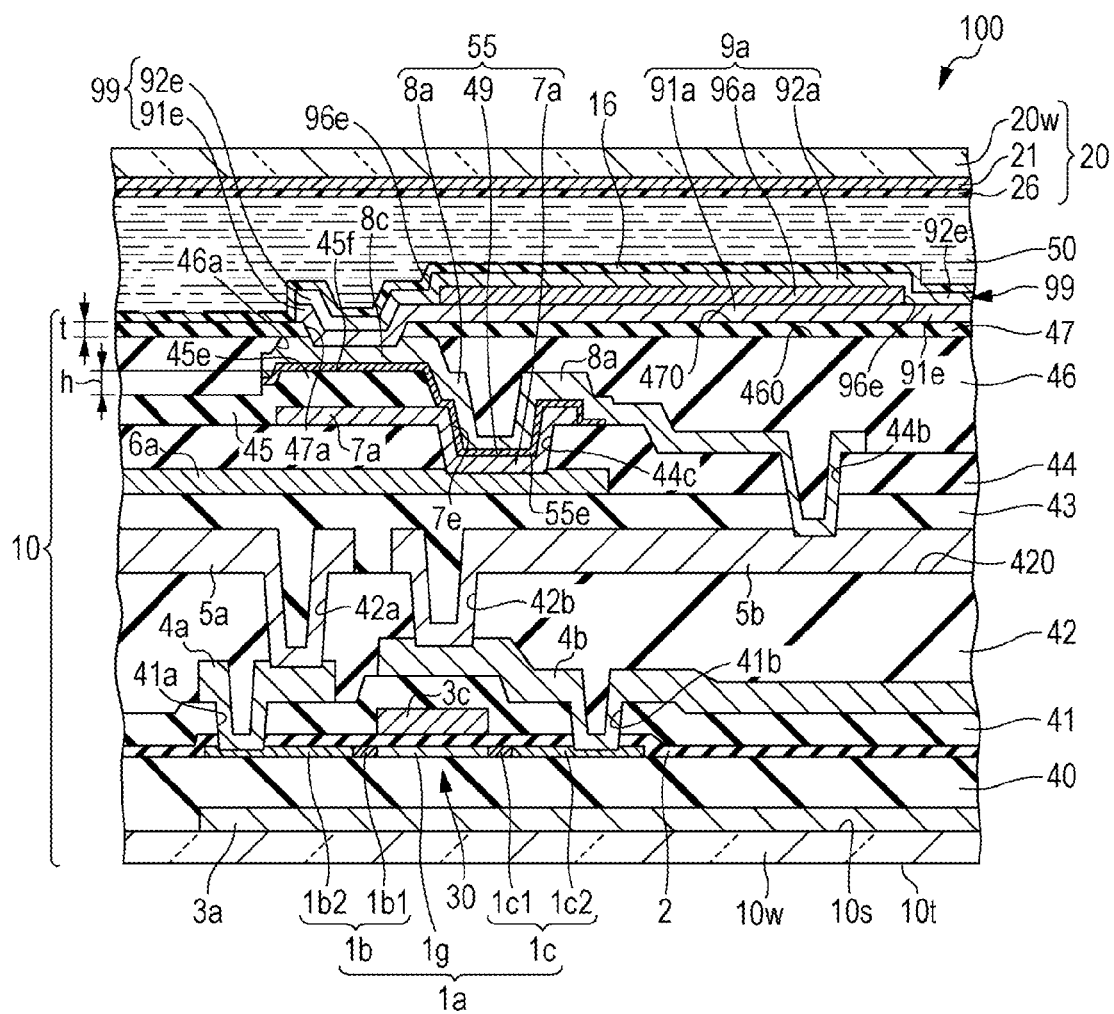
FIG. 5 is a sectional view schematically illustrating an aspect of a pixel of the electro-optical device to which the invention is applied.

FIG. 4 is a plan view illustrating an aspect of adjacent pixels in the first substrate 10 of the electro-optical device 100 to which the invention is applied. FIG. 5 is a sectional view schematically illustrating an aspect of the pixel of the electro-optical device 100 to which the invention is applied. Meanwhile, FIG. 5 illustrates a state in which the electro-optical device 100 is cut along the conduction parts of the data line 5a, the source area 1b of the pixel transistor 30, the scan line 3a, the pixel electrode 9a, and the relay electrode 8a. However, the drain area 1c of the pixel transistor 30 or the like may be shown in the drawing so as to easily understand the electrical connection relationship between the respective components.

Figure 7:
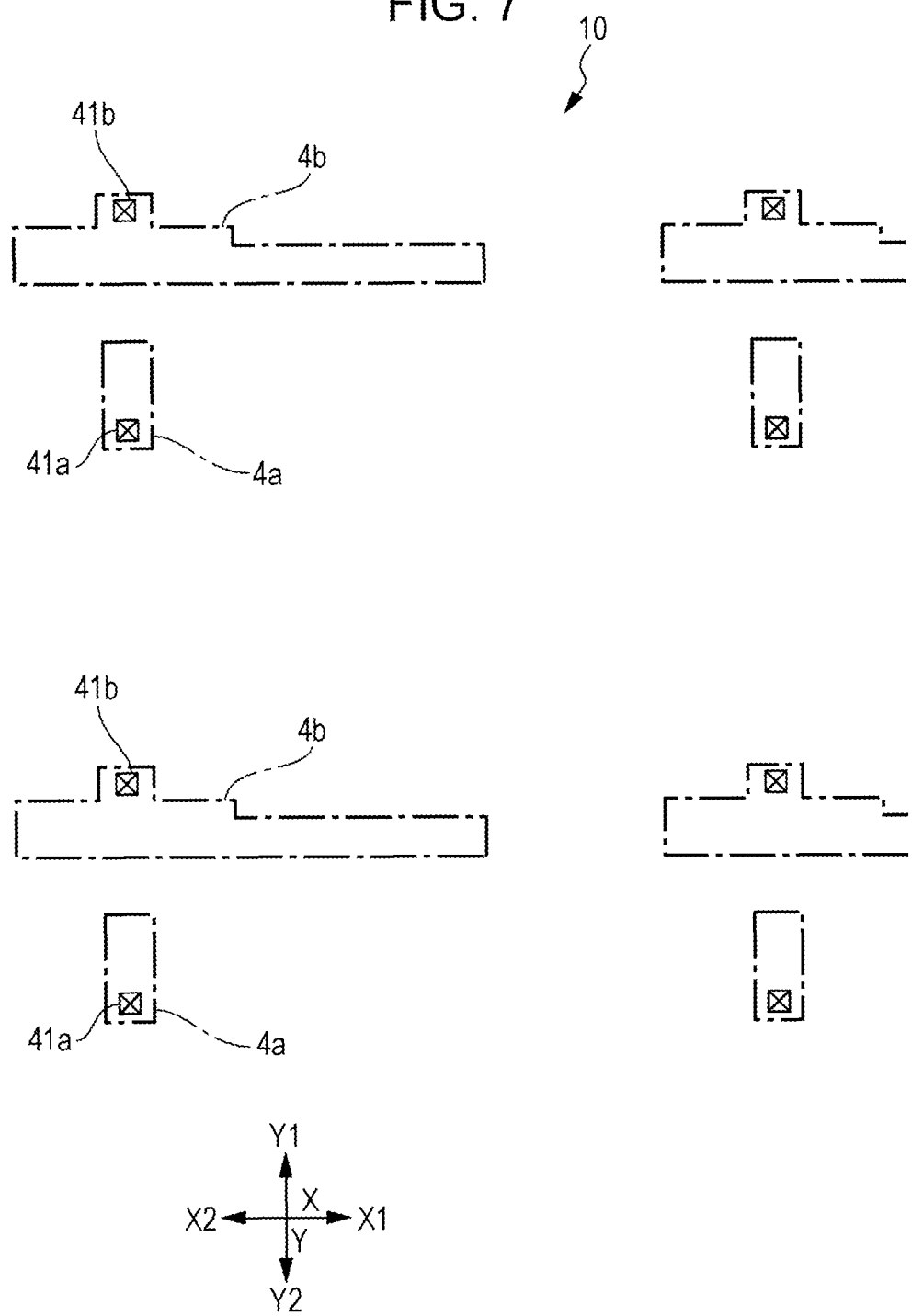
FIG. 7 is a plan view of a source electrode and a first drain electrode illustrated in FIGS. 3 and 4.
Figure 8:
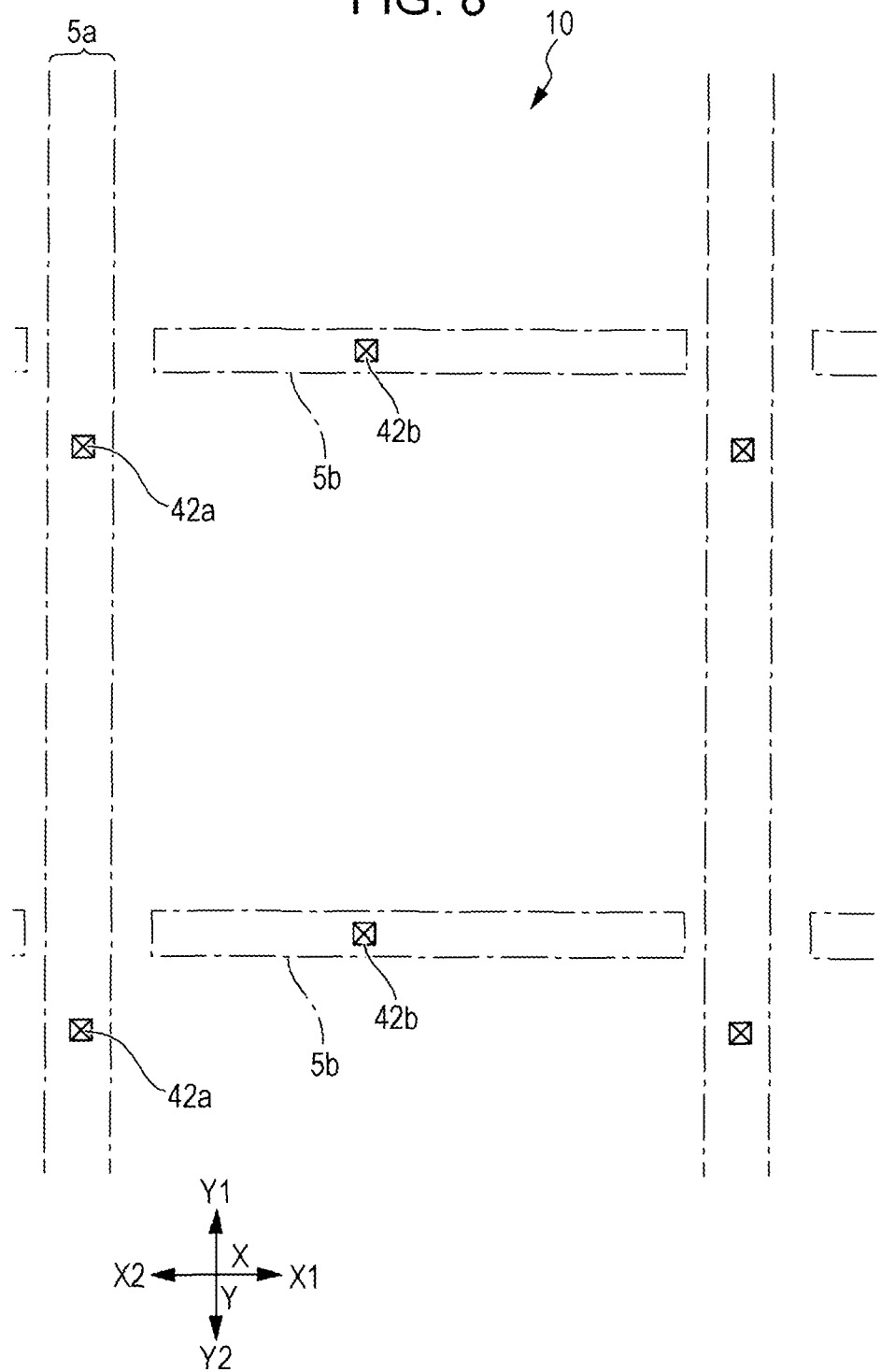
FIG. 8 is a plan view of a data line and a second drain electrode illustrated in FIGS. 3 and 4.
Figure 9:
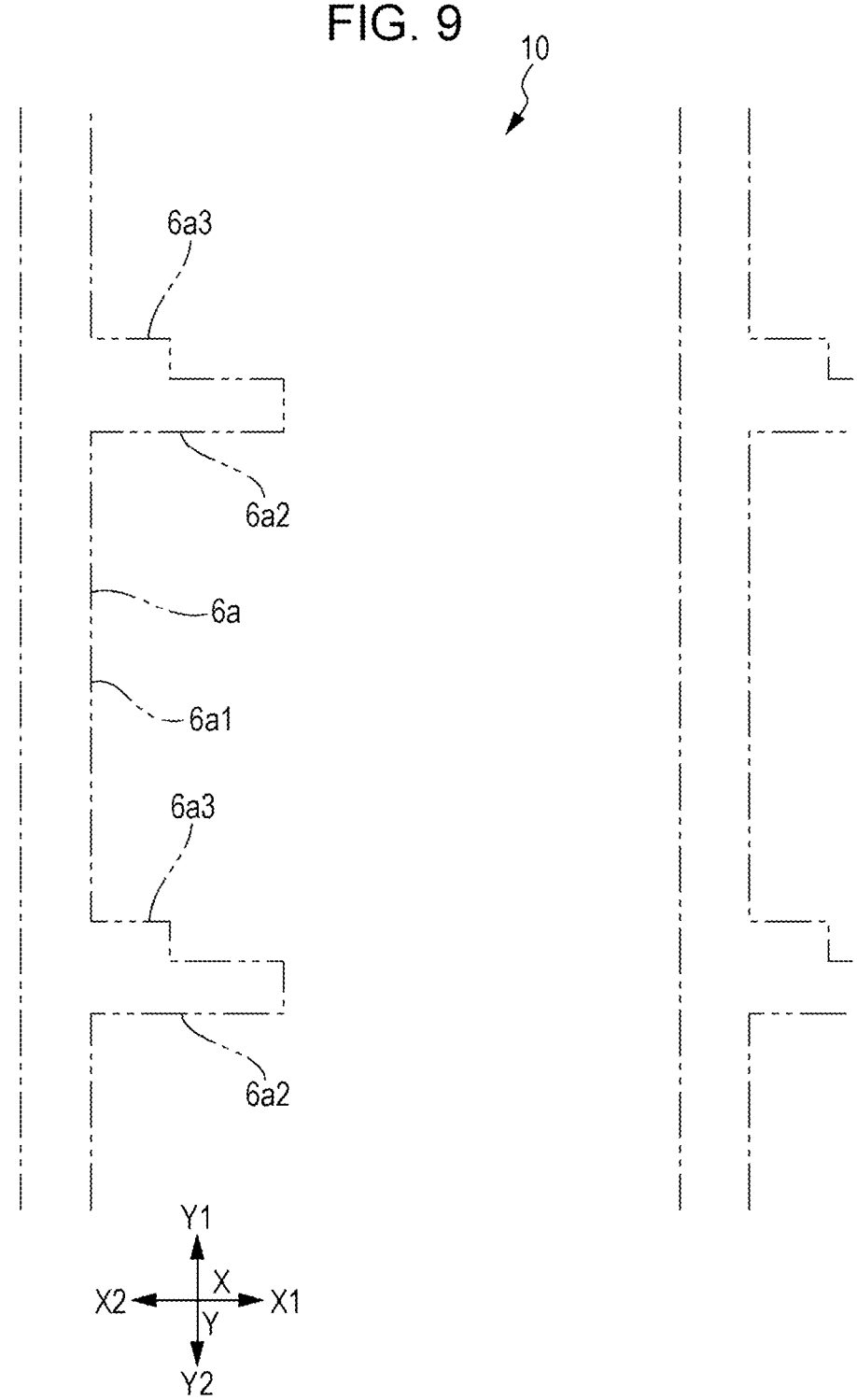
FIG. 9 is a plan view of a capacity line illustrated in FIGS. 3 and 4.
Figure 10:
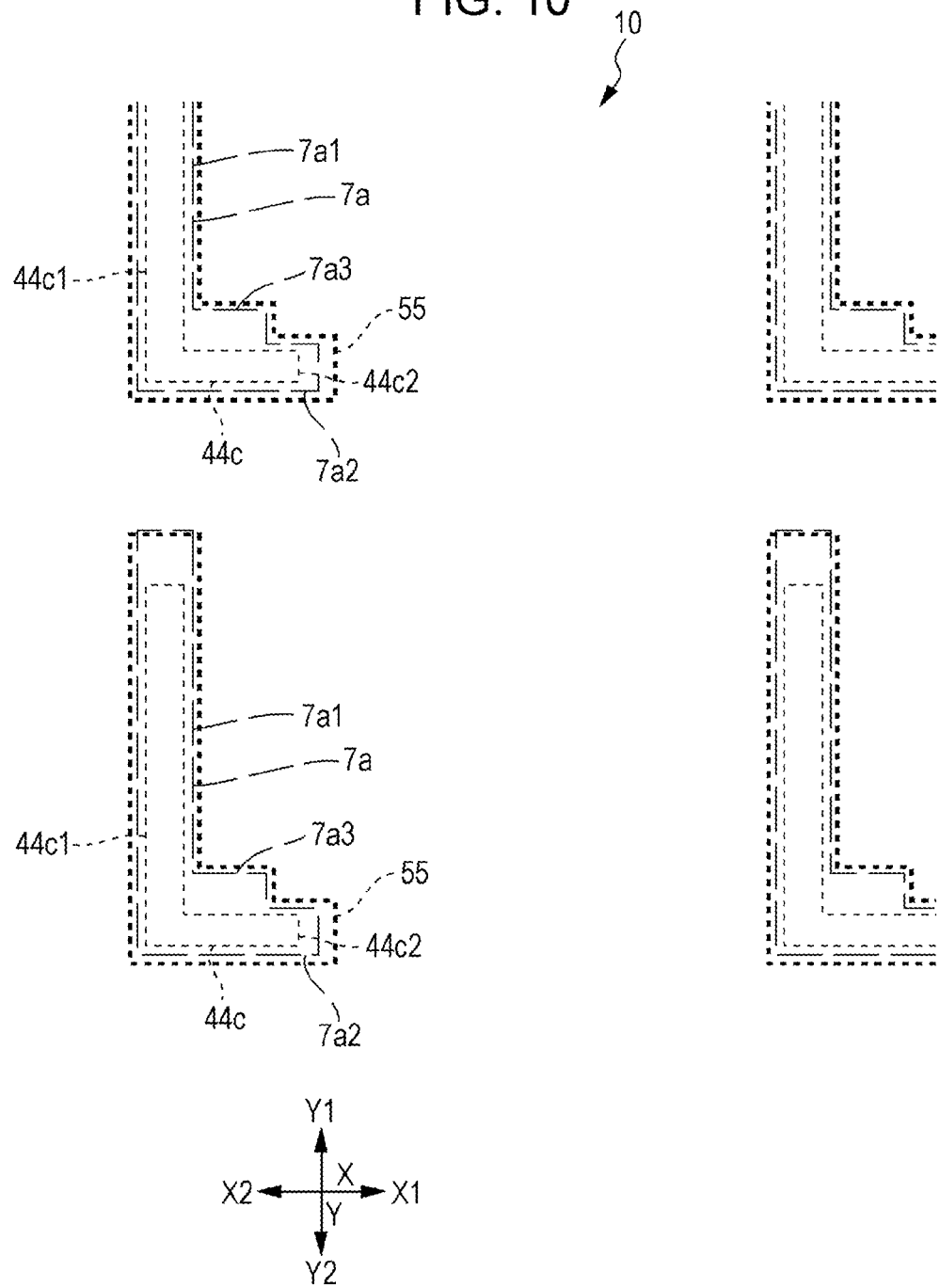
FIG. 10 is a plan view of a capacity electrode and a dielectric layer illustrated in FIGS. 3 and 4.
Figure 12:
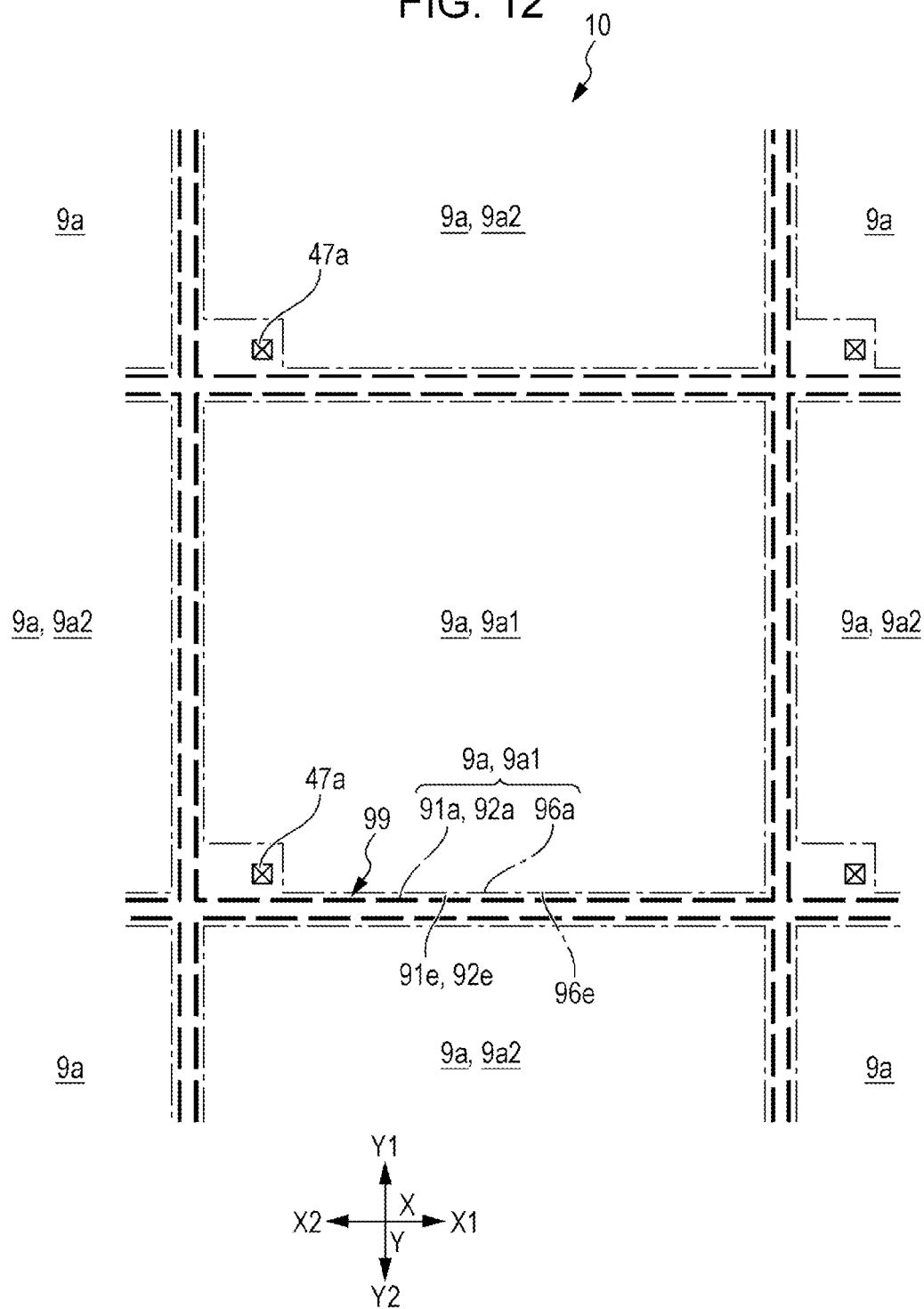
FIG. 12 is a plan view of a pixel electrode illustrated in FIGS. 3 and 4.

FIG. 6 is a plan view of the pixel transistor 30 illustrated in FIGS. 3 and 4. FIG. 7 is a plan view of a source electrode 4a and a first drain electrode 4b illustrated in FIGS. 3 and 4. FIG. 8 is a plan view of the data line 5a and a second drain electrode 5b. FIG. 9 is a plan view of the capacity line 6a illustrated in FIGS. 3 and 4. FIG. 10 is a plan view of a capacity electrode 7a illustrated in FIGS. 3 and 4. FIG. 11 is a plan view of the relay electrode 8a illustrated in FIGS. 3 and 4. FIG. 12 is a plan view of the pixel electrode 9a illustrated in FIGS. 3 and 4.

Meanwhile, the respective areas in FIGS. 4, 6, 7, 8, 9, 10, 11, and 12 are illustrated using the following lines. In addition, in FIG. 4, only the outer edge of the pixel electrode 9a is illustrated, and a refractive index adjusting dielectric film 96a is not formed.

FIGS. 4 and 6
Scan line 3a=thin solid line
Semiconductor layer 1a=thin and short dotted line
Gate electrode 3b=thick solid line
FIGS. 4 and 7
Source electrode 4a and first drain electrode 4b=thick dashed line
FIGS. 4 and 8
Data line 5a and second drain electrode 5b=thin dashed line
FIGS. 4 and 9
Capacity line 6a=thin two dashed line
FIGS. 4 and 10
Capacity electrode 7a=thin and long broken line
Dielectric layer 55e=thick and short broken line
Through hole 44c and recessed portion 7e=thin and short broken line
FIGS. 4 and 11
Capacity electrode 8a=thick two dashed line
Recessed portion 7e=thin and short broken line
FIGS. 4 and 12
Pixel electrode 9a (first transparent conductive film 91a and second transparent conductive film 92a)=thick and long broken line
Refractive index adjusting dielectric film 96a of pixel electrode 9a=thin dashed line Schematic Configuration of Pixel 100a As illustrated in FIG. 4, the rectangular pixel electrodes 9a are formed in the plurality of respective pixels 100a in the first substrate 10. The plurality of pixel electrodes 9a have the same configuration. One of the plurality of pixel electrodes 9a is expressed as a first pixel electrode 9a1, and pixel electrodes 9a, which are adjacent to the first pixel electrode 9a1, are expressed as second pixel electrodes 9a2. The data lines 5a and the scan lines 3a are formed along areas, which overlap the vertical and horizontal inter-pixel area 10f interposed by the adjacent pixel electrodes 9a (the first pixel electrode 9a1 and the second pixel electrodes 9a2) of the plurality of pixel electrodes 9a.

That is, the scan lines 3a extend along a first inter-pixel area 10g, which extends in the first direction (X direction), of the inter-pixel area 10f, and the data lines 5a extend along a second inter-pixel area 10h which extends in the second direction (Y direction). Each of the data line 5a and the scan line 3a linearly extends, and the pixel transistor 30 is formed to correspond to a part in which the data line 5a crosses the scan line 3a. Further, in the first substrate 10, various electrodes and wirings, which will be described later, are formed along the inter-pixel area 10f (the first inter-pixel area 10g and the second inter-pixel area 10h). Here, the data line 5a, the scan line 3a, and the like are formed of a light shading layer 10k. Therefore, the light shading layer 10k, which includes the data line 5a, the scan line 3a, various electrodes, and the like, extends along the end portions of the pixel electrode 9a, and defines the transparent area 9a0 (pixel opening) of the pixel electrode 9a.

As illustrated in FIG. 5, in the first substrate 10, the pixel transistor 30, the pixel electrode 9a, the oriented film 16, and the like are formed on the surface of the side (one side surface 10s) of the liquid crystal layer 50 of the transparent substrate main body 10w, such as a quartz substrate or a glass substrate. In the second substrate 20, the common electrode 21, the oriented film 26, and the like are formed on the surface of the side (one surface side facing the first substrate 10) of the liquid crystal layer 50 of the transparent substrate main body 20w, such as the quartz substrate or the glass substrate.

Configuration of Pixel Transistor 30

In the first substrate 10, the scan line 3a, which is formed of a conductive film, such as a conductive polysilicon film, a metal silicide film, a metal film or a metal film compound, is formed on the one side surface 10s of the substrate main body 10w. In the embodiment, the scan line 3a is formed of a light shading conductive film, such as a tungsten silicide (WSi$_x$), and functions as a light shading film for the pixel transistor 30.

A transparent underlying insulating film 40, such as a silicon oxide film, is formed on the upper layer side of the scan line 3a (side opposite to the substrate main body 10w for the scan line 3a). The semiconductor layer 1a of the pixel transistor 30 is formed on the upper layer side of the underlying insulating film 40 (side opposite to the substrate main body 10w for the underlying insulating film 40). The pixel transistor 30 includes the semiconductor layer 1a which extends along the data line 5a, and a gate electrode 3c which overlaps the central part of the semiconductor layer 1a in the extend direction (refer to FIG. 6). The pixel transistor 30 includes a transparent gate insulation layer 2 between the semiconductor layer 1a and the gate electrode 3c. The semiconductor layer 1a includes a channel area 1g which faces the gate electrode 3c through the gate insulation layer 2, and the source area 1b and the drain area 1c on both sides of the channel area 1g. In the embodiment, the pixel transistor 30 has an LDD structure. Accordingly, the respective source area 1b and the drain area 1c include low concentration areas 1b1 and 1c1 on both sides of the channel area 1g, and high concentration areas 1b2 and 1c2 in areas which are adjacent to the low concentration areas 1b1 and 1c1 on the side opposite to the channel area 1g.

The semiconductor layer 1a is formed of a polycrystalline silicon film or the like. The gate insulation layer 2 is formed of, for example, a two-layered structure which includes a first gate insulation layer that is formed of a silicon oxide film acquired by performing thermal oxidation on the semiconductor layer 1a, and a second gate insulation layer that is formed of a silicon oxide film formed using a CVD method or the like. The gate electrode 3c is formed of a conductive film, such as a conductive polysilicon film, a metal silicide film, a metal film, or a metal film compound, and is electrically conducted to the scan line 3a through the contact hole 2a, which passes through the gate insulation layer 2 and the underlying insulating film 40, on both sides of the semiconductor layer 1a (refer to FIG. 6) The gate electrode 3c has, for example, a two-layered structure which includes a conductive polysilicon film and a tungsten silicide film. In the embodiment, when light which passes through the electro-optical device 100 is reflected in another member, the scan line 3a is formed of a light shading conductive film for the purpose of preventing a malfunction due to photoelectric current from occurring in the pixel transistor 30 because the reflected light is incident into the semiconductor layer 1a. However, the scan line 3a may be formed on the upper layer of the gate insulation layer 2, and a part of the scan line 3a may be used as the gate electrode 3c. In this case, the scan line 3a illustrated in FIG. 5 is formed for the purpose of only light shading.

On the upper layer side of the gate electrode 3c (between the gate electrode 3c and the pixel electrode 9a), a transparent inter-layer insulation film 41 is formed. The inter-layer insulation film 41 includes a silicon oxide film or the like which is formed using a plasma CVD method or the like.

On the upper layer side of the inter-layer insulation film 41 (between the inter-layer insulation film 41 and the pixel electrode 9a), the source electrode 4a and the first drain electrode 4b are formed of the same kind of conductive film. The source electrode 4a and the first drain electrode 4b are formed of a light shading conductive film such as a conductive polysilicon film, a metal silicide film, metal film, or a metal film compound. In the embodiment, the source electrode 4a and the first drain electrode 4b are formed of, for example, a multi-layer film including a titanium (Ti) film, a titanium nitride (TiN) film and an aluminum (Al) film, a multi-layer film including a titanium nitride film and an aluminum film, and the like. The source electrode 4a is electrically conducted to the source area 1b through the contact hole 41a which passes through the inter-layer insulation film 41 and the gate insulation layer 2. The first drain electrode 4b is electrically conducted to the drain area 1c through the contact hole 41b which passes through the inter-layer insulation film 41 and the gate insulation layer 2. The source electrode 4a extends from a location which overlaps the source area 1b of the pixel transistor 30 to the second direction Y, and the first drain electrode 4b extends from a location which overlaps the drain area 1c of the pixel transistor 30 to the first direction X (refer to FIG. 7).

A transparent inter-layer insulation film 42 is formed on the upper layer side of the source electrode 4a and the first drain electrode 4b (between the source electrode 4a and the pixel electrode 9a). The inter-layer insulation film 42 includes, for example, a silicon oxide film or the like which is formed using a plasma CVD method or the like. In the embodiment, the surface of the inter-layer insulation film 42 is a flat surface 420 due to chemical-mechanical planarization or the like.

The data line 5a and the second drain electrode 5b are formed as the same kind conductive film on the upper layer side of the inter-layer insulation film 42 (between the inter-layer insulation film 42 and the pixel electrode 9a). The data line 5a and the second drain electrode 5b include a light shading conductive film such as a conductive polysilicon film, a metal silicide film, a metal film or a metal film compound. In the embodiment, the data line 5a and the second drain electrode 5b include, for example, a multi-layer film including a titanium film, a titanium nitride film, and an aluminum film, a multi-layer film including a titanium nitride film and an aluminum film, and the like. The data line 5a is electrically conducted to the source electrode 4a through a contact hole 42a which passes through the inter-layer insulation film 42. The second drain electrode 5b is electrically conducted to the first drain electrode 4b through a contact hole 42b which passes through the inter-layer insulation film 42. The data line 5a extends in an area which overlaps the second inter-pixel area 10h from a location which overlaps the source electrode 4a in the second direction Y. The second drain electrode 5b extends in an area which overlaps the first inter-pixel area 10g from a location which overlaps the first drain electrode 4b in the first direction X, and is electrically conducted to the first drain electrode 4b through the contact hole 42b in the approximately central location in the first direction X (refer to FIG. 8).

A transparent inter-layer insulation film 43 is formed on the upper layer sides of the data line 5a and the second drain electrode 5b (between the data line 5a and the pixel electrode 9a). The inter-layer insulation film 43 includes, for example, a silicon oxide film or the like which is formed using the plasma CVD method or the like.

Configuration of Maintenance Capacity 55

The capacity line 6a to which a constant potential is applied is formed on the upper layer of the inter-layer insulation film 43 (between the inter-layer insulation film 43 and the pixel electrode 9a). The capacity line 6a includes a light shading conductive film such as a conductive polysilicon film, a metal silicide film, a metal film or a metal film compound. In the embodiment, the capacity line 6a includes, for example, a multi-layer film including a titanium film, a titanium nitride film, and an aluminum film, a multi-layer film including a titanium nitride film and an aluminum film, and the like. The capacity line 6a includes a main line part 6a1 which extends in the second direction Y so as to overlap the data line 5a in planar view, and a branch line part 6a2 which protrudes from the main line part 6a1 toward one side X1 of the first direction X so as to overlap the scan line 3a in planar view, and the width of a part 6a3 which is connected to the main line part 6a1 at the branch line part 6a2 is larger than the width of the tip side (refer to FIG. 9).

A transparent inter-layer insulation film 44 is formed on the upper layer of the capacity line 6a (between the capacity line 6a and the pixel electrode 9a). The inter-layer insulation film 44 includes, for example, a silicon oxide film or the like which is formed using the plasma CVD method or the like.

The through hole 44c, which reaches the capacity line 6a, is formed in the inter-layer insulation film 44. The through hole 44c includes a first part 44c1 which extends from the intersection between the data line 5a and the scan line 3a to one side Y1 of the second direction Y along the data line 5a, and a second part 44c2 which extends from the intersection between the data line 5a and the scan line 3a to one side X1 of the first direction X along the scan line 3a (refer to FIG. 10).

The capacity electrode 7a is provided inside the through hole 44c, and the capacity electrode 7a is connected to the capacity line 6a at the bottom of the through hole 44c. The capacity electrode 7a includes a light shading conductive film such as a conductive polysilicon film, a metal silicide film, a metal film or a metal film compound. In the embodiment, the capacity electrode 7a includes, for example, a multi-layer film including a titanium film, a titanium nitride film, and an aluminum film, a multi-layer film including a titanium nitride film and an aluminum film, and the like. The capacity electrode 7a is formed at the whole bottom and the whole side surface of the through hole 44c, and is formed up to a part of the surface of the inter-layer insulation film 44. Accordingly, the capacity electrode 7a has a shape having the recessed portion 7e to which the through hole 44c is applied. The capacity electrode 7a includes a first part 7a1 which extends from the intersection between the data line 5a and the scan line 3a to one side Y1 of the second direction Y along the data line 5a, and overlaps the main line part 6a1 of the capacity line 6a in planar view (refer to FIG. 10). In addition, the capacity electrode 7a includes a second part 7a2 which extends from the intersection between the data line 5a and the scan line 3a to one side X1 of the first direction X along the scan line 3a, and overlaps the branch line part 6a2 of the capacity line 6a in planar view (refer to FIG. 10). In addition, the width of a part 7a3, which is connected to the first part 7a1, at the second part 7a2 is larger than the width of the tip side (refer to FIG. 10).

A transparent inter-layer insulation film 45 is formed on the upper layer of the capacity electrode 7a (between the capacity electrode 7a and the pixel electrode 9a). The inter-layer insulation film 45 includes, for example, a silicon oxide film or the like which is formed using the plasma CVD method or the like. The inter-layer insulation film 45 is not formed in an area which overlaps the through hole 44c in planar view but is formed only at the part 7a3 which is broadly formed in the capacity electrode 7a (refer to FIG. 10), and the peripheral thereof. In addition, a projection portion 45e, which protrudes toward the pixel electrode 9a, is formed at the part which overlaps the part 7a3 that is broadly formed in the capacity electrode 7a in planar view.

A dielectric layer 55e is formed inside the tip end surface 45f of the projection portion 45e and the through hole 44c. The dielectric layer 55e is formed at the whole bottom and the whole side surface of the through hole 44c, and, further, is formed in a range which is wider than the capacity electrode 7a. It is possible to use a silicon compound, such as a silicon oxide film and a silicon nitride film, as the dielectric layer 55e. In addition, it is possible to use a high dielectric constant dielectric film, such as an aluminum oxide film, a titanium oxide film, a tantalum oxide film, a niobium oxide film, a hafnium oxide film, a lantern oxide film, or a zirconium oxide film.

A relay electrode 8a (first electrode) is laminated on the upper layer of the dielectric layer 55e (between the dielectric layer 55e and the pixel electrode 9a), and the relay electrode 8a is formed on an area which overlaps a part of the surface of the inter-layer insulation film 44. The relay electrode 8a includes a light shading conductive film such as a conductive polysilicon film, a metal silicide film, a metal film or a metal film compound. In the embodiment, the relay electrode 8a includes, for example, a multi-layer film including a titanium film, a titanium nitride film, and an aluminum film, a multi-layer film including a titanium nitride film and an aluminum film, and the like. The relay electrode 8a includes a first part 8a1 which extends from the intersection between the data line 5a and the scan line 3a to one side Y1 of the second direction Y along the data line 5a, and overlaps the first part 7a1 of the capacity electrode 7a in planar view (refer to FIG. 11). In addition, the relay electrode 8a includes a second part 8a2 which extends from the intersection between the data line 5a and the scan line 3a to one side X1 of the first direction X along the scan line 3a, and overlaps the second part 7a2 of the capacity electrode 7a in planar view (refer to FIG. 11). The second part 7a2 further extends from a location which overlaps the second part 7a2 of the capacity electrode 7a in planar view to one side X1 of the first direction X, and is electrically conducted to the second drain electrode 5b through a contact hole 44b which passes through the inter-layer insulation films 43 and 44 (refer to FIG. 11). In addition, the width of a part 8a3 which is connected to the first part 8a1 in the second part 8a2 is wider than the width on the tip side, and a part of the part 8a2 is a conduction section 8c (refer to FIG. 5) which overlaps the tip end surface 45f of the projection portion 45e of the inter-layer insulation film 45 in planar view (refer to FIG. 11).

The relay electrode 8a overlaps the capacity electrode 7a at the whole bottom and the whole side surface of the through hole 44c in planar view. In addition, the dielectric layer 55e is laminated between the relay electrode 8a and the capacity electrode 7a. Accordingly, the relay electrode 8a, the dielectric layer 55e, and the capacity electrode 7a form the maintenance capacity 55 at the whole bottom and the whole side surface of the through hole 44c. According to the configuration, it is possible to provide the maintenance capacity 55 having high electrostatic capacitance in a narrow area.

Configuration of Conduction Parts of Relay Electrode 8a and Pixel Electrode 9a

A transparent inter-layer insulation film 46 (first insulation film) is formed between the relay electrode 8a and the pixel electrode 9a. The inter-layer insulation film 46 includes, for example, a silicon oxide film or the like which is formed using the plasma CVD method or the like. A flat surface 460, which exposes the conduction section 8c on the side of the pixel electrode 9a, is formed on the inter-layer insulation film 46, and the conduction section 8c is exposed in the opening 46a of the flat surface 460. Accordingly, the pixel electrode 9a comes into contact with the conduction section 8c which is exposed in the opening 46a.

In the embodiment, a transparent insulation film 47 (second insulation film) is formed between the inter-layer insulation film 46 and the pixel electrode 9a. An opening 47a, which overlaps, at least, a part of the exposure part of the conduction section 8c from the flat surface 460, is formed in the inter-layer insulation film 47, and the pixel electrode 9a comes into contact with the conduction section 8c inside the opening 46a of the inter-layer insulation film 46 and inside the opening 47a of the insulation film 47. The film thickness t of the insulation film 47 is thinner than the height h of the projection portion 45e of the inter-layer insulation film 45. Therefore, the depth of the opening 47a is shallow. In addition, a surface on a side opposite to the substrate main body 10w of the insulation film 47 (surface on the side of the pixel electrode 9a) is a flat surface 470. In the embodiment, the insulation film 47 includes a boron-doped silicate glass and the like.

Configuration of Pixel Electrode 9a

As illustrated in FIGS. 5 and 12, the pixel electrode 9a (second electrode) includes a lamination film (Index Matched ITO (IMITO) film) in which the refractive index adjusting dielectric film is laminated between the plurality of transparent conductive films. In the embodiment, the pixel electrode 9a has a three-layered structure in which a first transparent conductive film 91a, the refractive index adjusting dielectric film 96a, and a second transparent conductive film 92a are sequentially laminated. Therefore, when the respective refractive indexes and the film thicknesses of the first transparent conductive film 91a, the refractive index adjusting dielectric film 96a, and the second transparent conductive film 92a are adjusted, it is possible to suppress the dispersion of the wavelength of light in the pixel electrode 9a.

In the embodiment, the pixel electrode 9a includes a connection section 99 which electrically connects the first transparent conductive film 91a to the second transparent conductive film 92a in a location which overlaps the light shading layer 10k such as the scan line 3a, the data line 5a, and the capacity line 6a, which are described with reference to FIGS. 4 to 10, in planar view. More specifically, first, the first transparent conductive film 91a and the second transparent conductive film 92a are formed in the same area, and are overlapped in the same shape in planar view. In addition, the first transparent conductive film 91a and the second transparent conductive film 92a are formed in a wider range than the refractive index adjusting dielectric film 96a, and projects from the end portion of the refractive index adjusting dielectric film 96a in a location which overlaps the light shading layer 10k in planar view. Accordingly, the first transparent conductive film 91a comes into contact with and is electrically conducted to the second transparent conductive film 92a in the connection section 99 which includes the projecting parts 91e and 92e from the end portion of the refractive index adjusting dielectric film 96a. In the embodiment, the first transparent conductive film 91a and the second transparent conductive film 92a project from the end portion of the refractive index adjusting dielectric film 96a over the entire periphery of the refractive index adjusting dielectric film 96a. Accordingly, the connection section 99 is provided to surround over the entire periphery of refractive index adjusting dielectric film 96a. Meanwhile, the refractive index adjusting dielectric film 96a is not formed in the area which overlaps the connection part (opening 47a) of the pixel electrode 9a and the conduction section 8c in planar view.

Method of Manufacturing Electro-Optical Device 100

Figure 14:
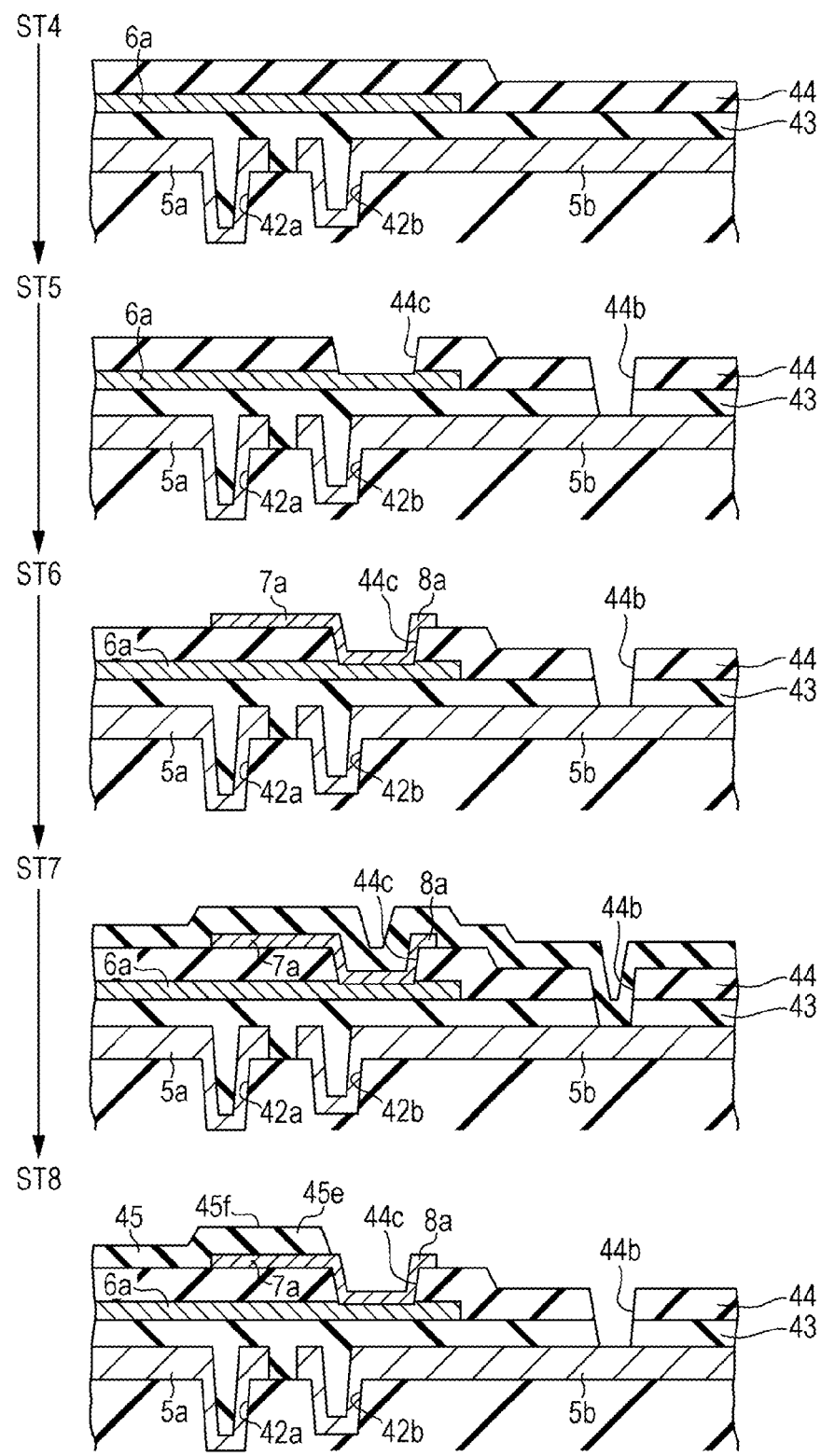
FIG. 14 is a sectional view illustrating a process for a method of manufacturing the electro-optical device to which the invention is applied.
Figure 15:
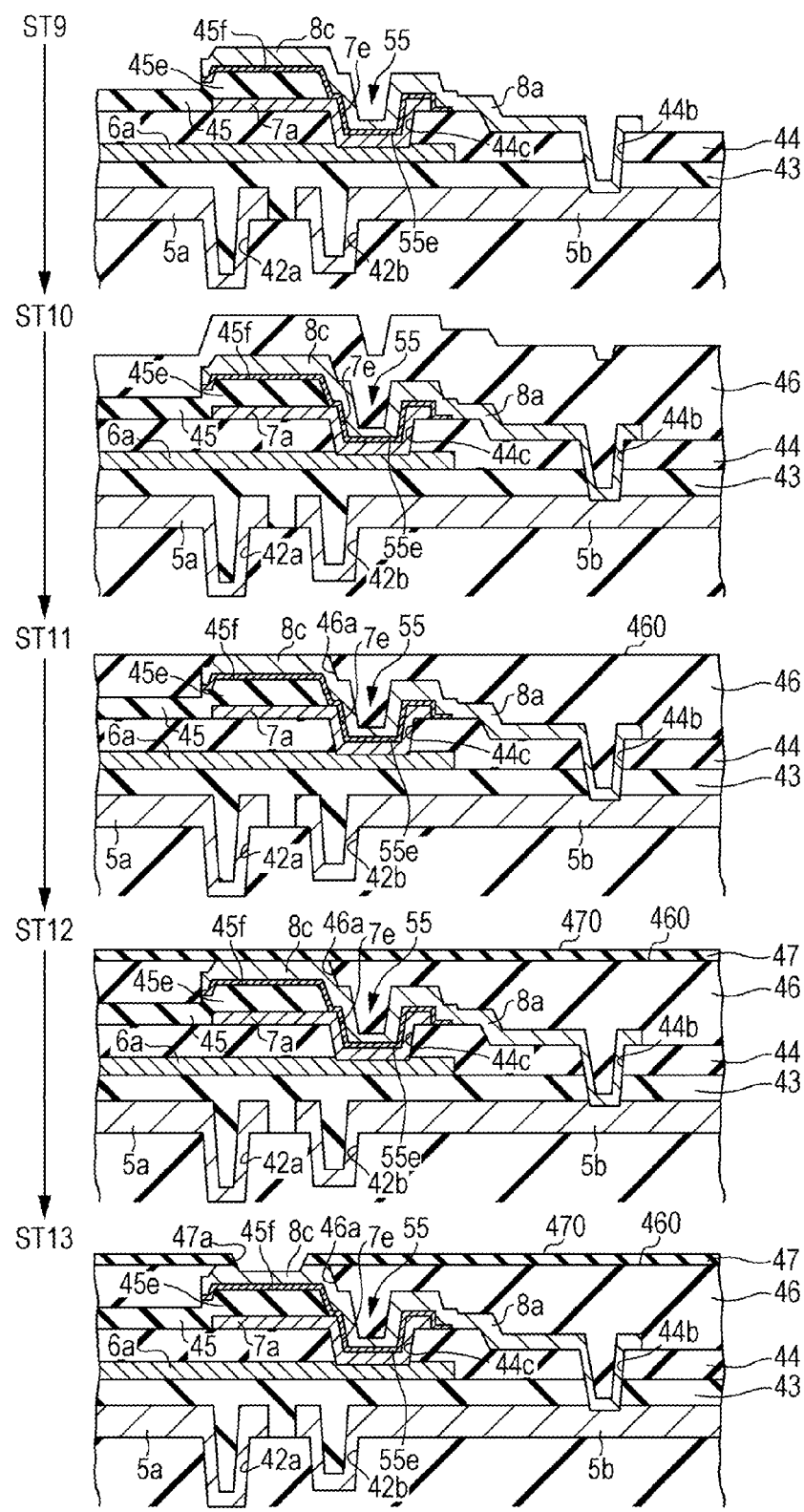
FIG. 15 is a sectional view illustrating a process for a method of manufacturing the electro-optical device to which the invention is applied.
Figure 16:
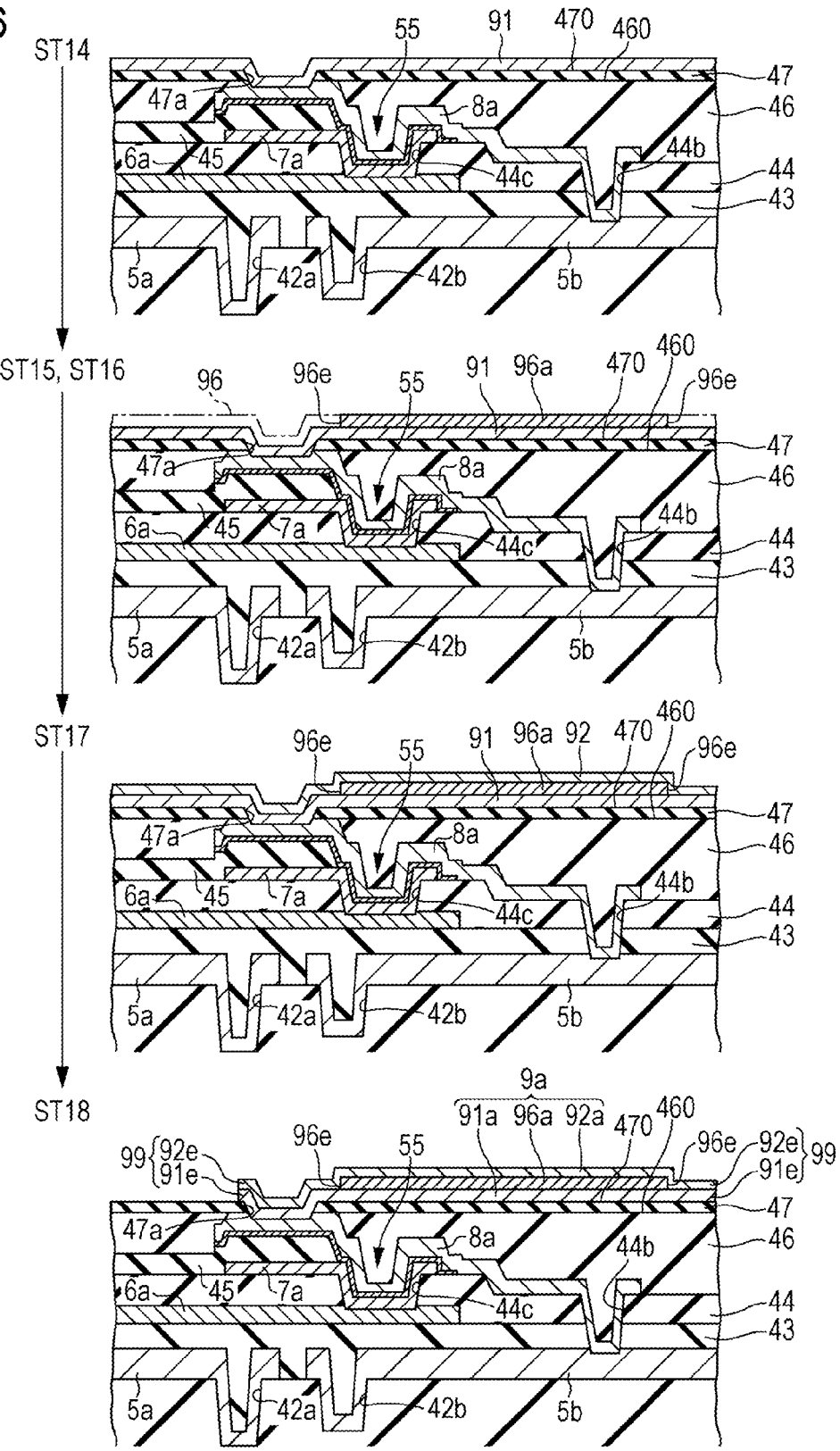
FIG. 16 is a sectional view illustrating a process for a method of manufacturing the electro-optical device to which the invention is applied.

A process of manufacturing the first substrate 10 of a process of manufacturing the electro-optical device 100 will be described with reference to FIGS. 13 to 16. FIGS. 13 to 16 are process sectional views illustrating a method of manufacturing the electro-optical device 100 to which the invention is applied. Meanwhile, FIGS. 14 to 16 illustrate only the sides of upper layers of the data line 5a.

Figure 13:
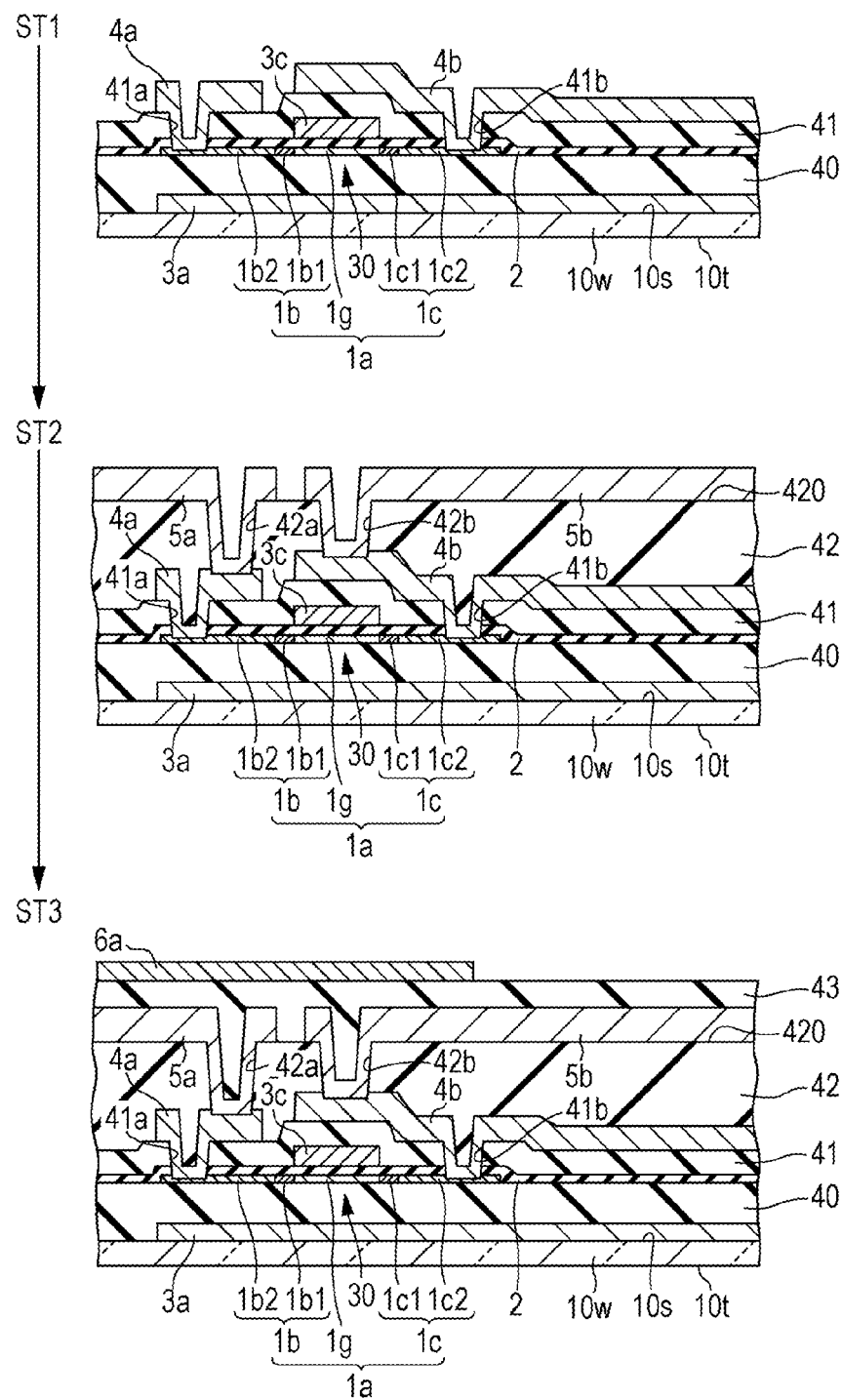
FIG. 13 is a sectional view illustrating a process for a method of manufacturing the electro-optical device to which the invention is applied.

In a pixel transistor forming process ST1 illustrated in FIG. 13, the inter-layer insulation film 41, the source electrode 4a, and the first drain electrode 4b are formed after the pixel transistor 30 is formed. Subsequently, in a data line forming process ST2, the contact holes 42a and 42b are formed after the inter-layer insulation film 42 is formed, and then the data line 5a and the second drain electrode 5b are formed. Subsequently, in a capacity line forming process ST3, the capacity line 6a is formed after the inter-layer insulation film 43 is formed.

Subsequently, in an inter-layer insulation film forming process ST4 illustrated in FIG. 14, the through hole 44c is formed in the inter-layer insulation film 44 in a through hole forming process ST5 after the inter-layer insulation film 44 is formed. At this time, the contact hole 44b, which passes through the inter-layer insulation film 44 and the inter-layer insulation film 43, is formed. Subsequently, in a capacity electrode forming process ST6, the conductive film is patterned and the capacity electrode 7a is formed after the conductive film is formed.

Subsequently, after the inter-layer insulation film 45 is formed in an inter-layer insulation film forming process ST7, the inter-layer insulation film 45 is etched and the inter-layer insulation film 45 is removed from the area, in which the through hole 44c is formed, in a projection portion forming process ST8. At this time, if necessary, a mask forming process and etching are performed in a plurality of times, and the projection portion 45e which protrudes toward a side opposite to the substrate main body 10w is formed in the inter-layer insulation film 45. Meanwhile, after an etching mask is formed through a photo lithography process using a halftone mask, etching may be performed and the inter-layer insulation film 45, which includes the projection portion 45e, may be formed.

Subsequently, in a maintenance capacity forming process ST9 illustrated in FIG. 15, after the dielectric film is formed, the dielectric film is patterned, and the dielectric layer 55e is formed. Subsequently, after the conductive film is formed, the conductive film is patterned, and the relay electrode 8a is formed. Meanwhile, after the dielectric layer 55e is formed, the contact hole 44b, which passes through the inter-layer insulation film 44 and the inter-layer insulation film 43, may be formed.

Subsequently, in an inter-layer insulation film forming process ST10, the inter-layer insulation film 46, which includes a silicon oxide film or the like, is formed. Subsequently, in a planarization process ST11, a planarization process, such as chemical-mechanical planarization, is performed on the inter-layer insulation film 46, and the surface of the inter-layer insulation film 46 becomes the flat surface 460. As a result, the conduction section 8c is exposed from the opening 46a of the flat surface 460, and the conduction section 8c forms a plane which is continued to the flat surface 460. Subsequently, in an insulation film forming process ST12, the insulation film 47, which includes a boron-doped silicate glass or the like, is formed. The insulation film 47 is formed on the flat surface 460 of the inter-layer insulation film 46 and the surface of the conduction section 8c, and thus the surface of the insulation film 47 is the flat surface 470. Subsequently, in an opening forming process ST13, the opening 47a is formed in a location which overlaps the conduction section 8c of the insulation film 47 in planar view.

Subsequently, a pixel electrode forming process illustrated in FIG. 16 is performed. In the pixel electrode forming process, a first transparent conductive film 91 is formed on the surface (flat surface 470) of the insulation film 47 in a first process ST14. Subsequently, in a second process ST15, the refractive index adjusting dielectric film 96, which includes a silicon oxide film, an aluminum oxide film, and the like, is laminated on the surface (side opposite to the substrate main body 10w) of the first transparent conductive film 91. Thereafter, in a third process ST16, an area, which overlaps the light shading layer 10k that is described with reference to FIG. 4 in planar view, is etched in the refractive index adjusting dielectric film 96, and the first transparent conductive film 96 is partially exposed in the area which overlaps the light shading layer 10k in planar view. As a result, the refractive index adjusting dielectric film 96a remains in the area (the transparent area 9a0 illustrated in FIG. 4) which is surrounded by the light shading layer 10k. At this time, etching of high etching selectivity is performed on the refractive index adjusting dielectric film 96a and the first transparent conductive film 91, and the refractive index adjusting dielectric film 96 is etched using the first transparent conductive film 91 as an etching stopper.

Subsequently, in a fourth process ST17, a second transparent conductive film 92 is laminated on a side opposite to the surface (substrate main body 10w) of the refractive index adjusting dielectric film 96a. As a result, a connection section 99, which connects the first transparent conductive film 91 to the second transparent conductive film 92, is formed at the exposure part from the refractive index adjusting dielectric film 96a of the first transparent conductive film 91. That is, in the first transparent conductive film 91 and the second transparent conductive film 92, the projecting parts 91e and 92e from the end portion 96e of the refractive index adjusting dielectric film 96a overlap to be connected to each other, and the connection section 99 is formed.

Subsequently, in a fifth process ST18, the first transparent conductive film 91 and the second transparent conductive film 92 are patterned such that the part, which overlaps at least the transparent area 9a0 in planar view, and the connection section 99 remain. In the embodiment, in the fifth process, the first transparent conductive film 91 and the second transparent conductive film 92 are etched using a common etching mask, the first transparent conductive film 91 and the second transparent conductive film 92 are patterned in the same shape. As a result, the pixel electrode 9a is formed by the lamination film in which the first transparent conductive film 91a, the refractive index adjusting dielectric film 96a, and the second transparent conductive film 92a are sequentially laminated. Thereafter, as illustrated in FIG. 5, when the oriented film 16 is formed on the surface of the pixel electrode 9a, the first substrate 10 is completed.

According to the manufacturing method, the first transparent conductive film 91a and the second transparent conductive film 92a are formed by etching the first transparent conductive film 91 and the second transparent conductive film 92 using the common etching mask, and thus there is an advantage in that productivity is high. In addition, when the refractive index adjusting dielectric film 96 is etched in the third process ST16, the first transparent conductive film 91 is used as the etching stopper. Therefore, it is possible to securely remove the refractive index adjusting dielectric film 96 from the area which overlaps the light shading layer 10k in planar view. Accordingly, in the connection section 99, the first transparent conductive film 91a and the second transparent conductive film 92a are securely conducted.

Primary Effect of Embodiment

As described above, the relay electrode 8a (first electrode) includes the conduction section 8c which overlaps the projection portion 45e of the inter-layer insulation film 45, and the pixel electrode 9a (second electrode) comes into contact with the conduction section 8c of the relay electrode 8a which is exposed from the surface (flat surface 460) of the inter-layer insulation film 46 (first insulation film). Therefore, a large uneven part is hardly generated on the surface of the pixel electrode 9a. In addition, the insulation film 47 (second insulation film) having a film thickness t which is thinner than the height h of the projection portion 45e is formed on the surface (flat surface 460) of the inter-layer insulation film 46, and the pixel electrode 9a is electrically conducted to the conduction section 8c through the opening 47a of the insulation film 47. With regard to the insulation film 47, the degree of freedom is high for a material and the configuration of the film thickness or the like. Accordingly, it is possible to form the insulation film 47 of boron-doped silicate glass. In this case, a surface which is exposed from the pixel electrode 9a is the boron-doped silicate glass. Accordingly, it is possible to adsorb and maintain moisture, which intrudes in the way of the manufacturing process, and moisture, which exists in the liquid crystal layer 50, using the insulation film 47, and thus it is possible to suppress the deterioration of the liquid crystal layer 50 due to moisture. In addition, it is possible to cause the part, which overlaps the pixel electrode 9a in the insulation film 47 in planar view, to function as the refractive index adjusting dielectric film that suppresses the dispersion of the wavelength of light. In this case, the opening 47a is shallow, and thus a large uneven part is hardly generated on the surface of the pixel electrode 9a. Here, even when the insulation film 47 is not formed and the inter-layer insulation film 46 is formed of the boron-doped silicate glass or the like, the deterioration of the liquid crystal layer 50 can be performed due to moisture. However, in the case of the boron-doped silicate glass, the film thickness easily varies, and thus variation easily occurs in a process of exposing the conduction section 8c by performing the chemical-mechanical planarization on the inter-layer insulation film 46. However, in the embodiment, the thin insulation film 47, which includes the boron-doped silicate glass or the like, is formed between the inter-layer insulation film 46 and the pixel electrode 9a, and thus it is possible to perform the deterioration of the liquid crystal layer 50 due to moisture by the insulation film 47 and it is possible to stably perform the process of exposing the conduction section 8c by performing the chemical-mechanical planarization on the inter-layer insulation film 46 which includes a silicon oxide film or the like.

In addition, the projection portion 45e overlaps the capacity electrode 7a in planar view. Therefore, it is possible to use the thickness or the like of the capacity electrode 7a to form the projection portion 45e.

In addition, the pixel electrode 9a includes the lamination film in which the first transparent conductive film 91a, the refractive index adjusting dielectric film 96a, and the second transparent conductive film 92a are laminated, and thus it is possible to suppress the dispersion of the wavelength of light which passes through the pixel electrode 9a. In addition, in the pixel electrode 9a, the connection section 99 which connects the first transparent conductive film 91a to the second transparent conductive film 92a is provided, and thus it is possible to apply the same potential as the first transparent conductive film 91a to the second transparent conductive film 92a. Therefore, it is not necessary to apply a high drive voltage to the pixel electrode 9a, and thus it is possible to properly drive the liquid crystal layer 50. In addition, the connection section 99 is provided in the area which overlaps the light shading layer 10k in planar view, and thus a situation, in which the connection section 99 reduces the amount of light that passes through the pixel electrode 9a, does not easily occur.

In addition, the connection section 99 includes the parts of the first transparent conductive film 91a and the second transparent conductive film 92a, which protrude to be connected to the end portion of the refractive index adjusting dielectric film 96a. Therefore, the connection section 99 is provided at the end portion of the pixel electrode 9a, and thus it is easy to provide the connection section 99 in the area which overlaps the light shading layer 10k in planar view. In addition, the connection section 99 is provided to surround the periphery of the refractive index adjusting dielectric film 96a, and thus it is possible to reduce the electrical resistance of the entire pixel electrode 9a.

Modification Example 1

Figure 17:
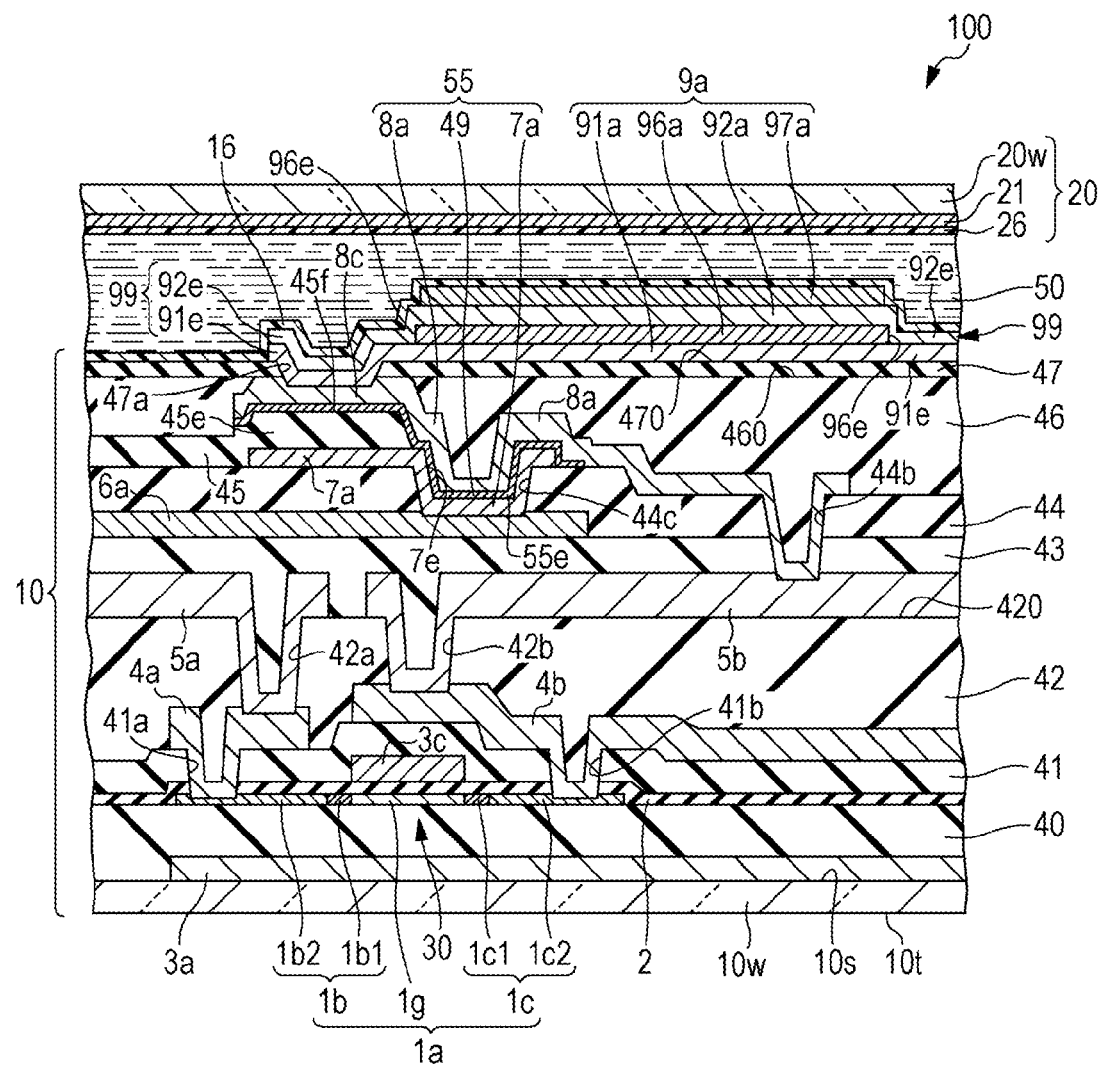
FIG. 17 is an explanatory diagram of Modification Example 1 of the electro-optical device to which the invention is applied.

FIG. 17 is an explanatory diagram of a Modification Example 1 of the electro-optical device to which the invention is applied. Meanwhile, the basic configurations of both the example and Modification Examples, which will be described later, are the same as the embodiment which is described with reference to FIGS. 1 to 16, and thus the same reference symbols are attached to common parts and the description thereof will not be repeated.

In the embodiment illustrated in FIG. 5, the pixel electrode 9a has the three-layered structure of the first transparent conductive film 91a, the refractive index adjusting dielectric film 96a, and the second transparent conductive film 92a. In contrast, in the embodiment, as illustrated in FIG. 17, the pixel electrode 9a has a four-layered structure in which the first transparent conductive film 91a, the refractive index adjusting dielectric film 96a, the second transparent conductive film 92a, and the refractive index adjusting dielectric film 97a are sequentially laminated.

Modification Example 2

Figure 18:
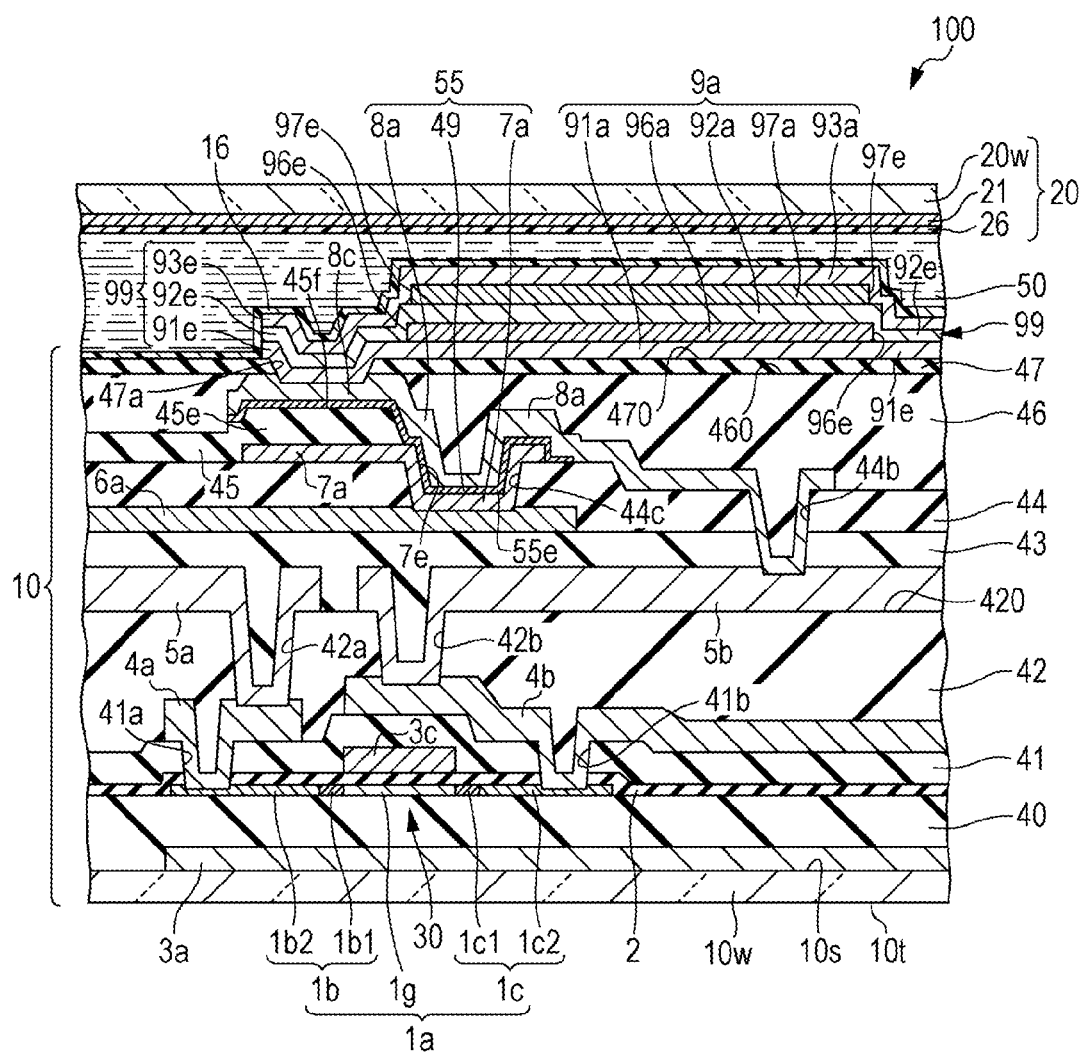
FIG. 18 is an explanatory diagram of Modification Example 2 of the electro-optical device to which the invention is applied.

FIG. 18 is an explanatory diagram of Modification Example 2 of an electro-optical device to which the invention is applied. As illustrated in FIG. 18, the pixel electrode 9a has a five-layered structure in which the first transparent conductive film 91a, the refractive index adjusting dielectric film 96a, the second transparent conductive film 92a, the refractive index adjusting dielectric film 97a, and the third transparent conductive film 93a are sequentially laminated. Here, the refractive index adjusting dielectric films 96a and 97a have the same plane shape. In addition, the first transparent conductive film 91a, the second transparent conductive film 92a, and the third transparent conductive film 93a have the same plane shape. In the connection section 99, the projecting part 91e of the first transparent conductive film 91a, which projects from the end portion 96e of the refractive index adjusting dielectric film 96a, is connected to the projecting part 92e of the second transparent conductive film 92a. In addition, in the connection section 99, the projecting part 92e of the second transparent conductive film 92a, which projects from the end portion 97e of the refractive index adjusting dielectric film 97a, is connected to the projecting part 93e of the third transparent conductive film 93a.

Other Embodiment

In the above-described embodiment, in the pixel electrode 9a, the first transparent conductive film 91a and the second transparent conductive film 92a are projected from the end portion of the refractive index adjusting dielectric film 96a to be connected to each other. However, if the connection section 99 overlaps the light shading layer 10k in planar view, a contact hole, which is formed in a location other than the end portion of the refractive index adjusting dielectric film 96a, may be the connection section 99 between the first transparent conductive film 91a and the second transparent conductive film 92a.

In the above-described embodiment, the three-layered structure, the four-layered structure, and the five-layered structure are exemplified as the pixel electrode 9a. However, the invention may be applied to a case in which the pixel electrode 9a is formed by a lamination film having six or more layers.

In the above-described embodiment, the pixel electrode 9a is the lamination film. However, when the pixel electrode 9a is a single-layered film, the conduction structure of the pixel electrode 9a and the relay electrode 8a according to the invention may be used.

In the above-described embodiment, the pixel electrode 9a is transparent. However, when the pixel electrode 9a is reflective, the conduction structure of the pixel electrode 9a and the relay electrode 8a according to the invention may be used.

In the above-described embodiment, an example in which the invention is applied to the electro-optical device 100 is described. However, the invention is applied to an electro-optical device 100, such as an organic electroluminescence apparatus or an electrophoretic display panel, other than the liquid crystal apparatus.

Example of Configuration of Electronic Apparatus

Configuration of Projection-Type Display Apparatus

Figure 19:
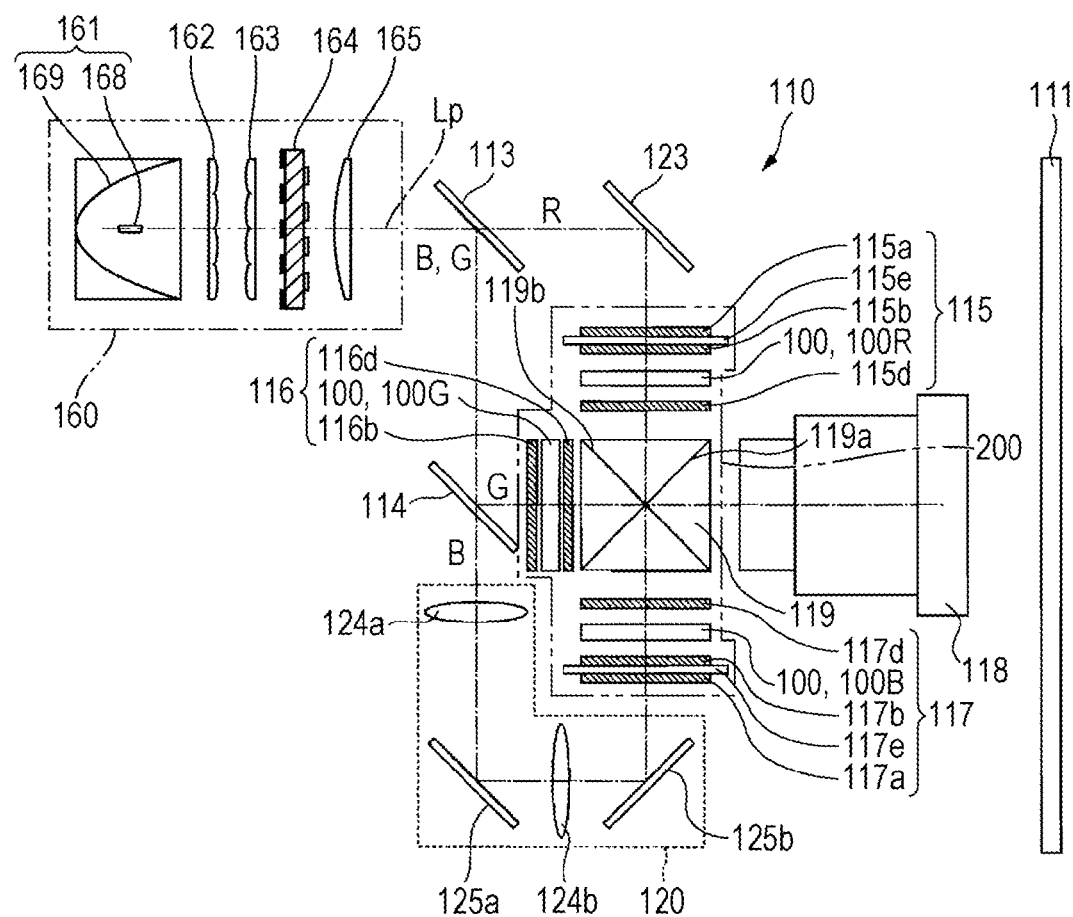
FIG. 19 is a schematic block diagram illustrating an aspect of a projection-type display apparatus (electronic apparatus) using an electro-optical device to which the invention is applied.

FIG. 19 is a schematic block diagram illustrating an aspect of a projection-type display apparatus 110 (electronic apparatus) using the electro-optical device 100 to which the invention is applied. Meanwhile, in the description below, a plurality of electro-optical devices 100, to which light having different wavelength regions is supplied, are used. However, the electro-optical device 100 to which the invention is applied is used for all of the electro-optical devices 100.

The projection-type display apparatus 110 illustrated in FIG. 19 is a liquid crystal projector using the transmission-type electro-optical device 100, and displays an image by irradiating light to a projecting member which includes a screen 111 or the like. The projection-type display apparatus 110 includes, along an optical axis L of the apparatus, a lighting device 160, a plurality of electro-optical devices 100 (liquid crystal light valves 115 to 117) to which light emitted from the lighting device 160 is supplied, a cross dichroic prism 119 (photosynthetic optical system) which synthesizes and emits light that is emitted from the plurality of electro-optical devices 100, and a projection optical system 118 which projects light synthesized by the cross dichroic prism 119. In addition, the projection-type display apparatus 110 includes dichroic mirrors 113 and 114, and a relay system 120. In the projection-type display apparatus 110, the electro-optical device 100 and the cross dichroic prism 119 form an optical unit 200.

In the lighting device 160, along the optical axis L of the apparatus, a light source section 161, a first integrator lens 162, such as a fly-eye lens, which includes a lens array, a second integrator lens 163, such as a fly-eye lens, which includes a lens array, a polarized light conversion element 164, and a condenser lens 165 are sequentially arranged. The light source section 161 includes a light source 168 which emits white light including red light R, green light G and blue light B, and a reflector 169. The light source 168 is formed of an extra-high pressure mercury lamp or the like, and the reflector 169 includes a parabolic cross section. The first integrator lens 162 and the second integrator lens 163 equalize the illuminance distribution of light emitted from the light source section 161. The polarized light conversion element 164 causes light emitted from the light source section 161 to be polarized light which has a specific vibration direction similar to, for example, s-polarized light.

A dichroic mirror 113 causes red light R, which is included in light emitted from the lighting device 160, to pass therethrough, and reflects green light G and blue light B. A dichroic mirror 114 causes blue light B of green light G and blue light B, which are reflected in the dichroic mirror 113, to pass therethrough, and reflects green light G. As above, the dichroic mirrors 113 and 114 form a color separation optical system which separates light emitted from the lighting device 160 into red light R, green light G, and blue light B.

A liquid crystal light valve 115 is a transmission-type liquid crystal apparatus that modulates red light R, which passes through the dichroic mirror 113 and is reflected in a reflection mirror 123, according to an image signal. The liquid crystal light valve 115 includes a λ/2 phase difference plate 115a, a first polarizing plate 115b, an electro-optical device 100 (red electro-optical device 100R), and a second polarizing plate 115d. Here, even when red light R, which is incident into the liquid crystal light valve 115, passes through the dichroic mirror 113, polarized light is not changed, and thus s-polarized light is not changed.

The λ/2 phase difference plate 115a is an optical element that converts s-polarized light which is incident into the liquid crystal light valve 115 into p-polarized light. The first polarizing plate 115b is a polarizing plate that cuts off s-polarized light and causes p-polarized light to pass therethrough. The electro-optical device 100 (red electro-optical device 100R) is formed to convert p-polarized light into s-polarized light (in a case of halftone, circularly polarized light or elliptically polarized light) through modulation according to the image signal. The second polarizing plate 115d is a polarizing plate that cuts off p-polarized light and causes s-polarized light to pass therethrough. Accordingly, the liquid crystal light valve 115 modulates red light R according to the image signal, and emits modulated red light R toward the cross dichroic prism 119. The λ/2 phase difference plate 115a and the first polarizing plate 115b are arranged in a state in which the λ/2 phase difference plate 115a and the first polarizing plate 115b come into contact with a transparent glass plate 115e which does not convert polarized light, and it is possible to prevent distortion of the λ/2 phase difference plate 115a and the first polarizing plate 115b due to the generation of heat.

A liquid crystal light valve 116 is a transmission-type liquid crystal apparatus that modulates green light G, which is reflected in the dichroic mirror 114 after being reflected in the dichroic mirror 113, according to the image signal. The liquid crystal light valve 116 includes a first polarizing plate 116b, an electro-optical device 100 (green electro-optical device 100G), and a second polarizing plate 116d, similar to the liquid crystal light valve 115. Green light G, which is incident into the liquid crystal light valve 116, is s-polarized light which is reflected in and incident into the dichroic mirrors 113 and 114. The first polarizing plate 116b is a polarizing plate that cuts off p-polarized light and causes s-polarized light to pass therethrough. The electro-optical device 100 (green electro-optical device 100G) is formed to convert s-polarized light into p-polarized light (in a case of halftone, circularly polarized light or elliptically polarized light) through modulation according to the image signal. The second polarizing plate 116d is a polarizing plate that cuts off s-polarized light and causes p-polarized light to pass therethrough. Accordingly, the liquid crystal light valve 116 modulates green light G according to the image signal, and emits modulated green light G toward the cross dichroic prism 119.

The liquid crystal light valve 117 is a transmission-type liquid crystal apparatus that modulates blue light B, which is reflected in the dichroic mirror 113 and passes through the relay system 120 after passing through the dichroic mirror 114, according to the image signal. The liquid crystal light valve 117 includes a λ/2 phase difference plate 117a, a first polarizing plate 117b, an electro-optical device 100 (blue electro-optical device 100B), and a second polarizing plate 117d, similar to the liquid crystal light valves 115 and 116. Blue light B, which is incident into the liquid crystal light valve 117, is reflected in the two reflection mirrors 125a and 125b of the relay system 120 after being reflected in the dichroic mirror 113 and passing through the dichroic mirror 114, and thus blue light B is s-polarized light.

The λ/2 phase difference plate 117a is an optical element that converts s-polarized light, which is incident into the liquid crystal light valve 117, into p-polarized light. The first polarizing plate 117b is a polarizing plate that cuts off s-polarized light and causes p-polarized light to pass therethrough. The electro-optical device 100 (blue electro-optical device 100B) is formed to convert p-polarized light into s-polarized light (in a case of halftone, circularly polarized light or elliptically polarized light) through modulation according to the image signal. The second polarizing plate 117d is a polarizing plate that cuts off p-polarized light and causes s-polarized light to pass therethrough. Accordingly, the liquid crystal light valve 117 modulates blue light B according to the image signal, and emits modulated blue light B toward the cross dichroic prism 119. Meanwhile, the λ/2 phase difference plate 117a and the first polarizing plate 117b are arranged in a state in which the λ/2 phase difference plate 117a and the first polarizing plate 117b come into contact with a glass plate 117e.

The relay system 120 includes relay lenses 124a and 124b and reflection mirrors 125a and 125b. The relay lenses 124a and 124b are provided to prevent optical loss due to long optical path of blue light B. The relay lens 124a is arranged between the dichroic mirror 114 and the reflection mirror 125a. The relay lens 124b is arranged between the reflection mirrors 125a and 125b. The reflection mirror 125a reflects blue light B, which passes through the dichroic mirror 114 and is emitted from the relay lens 124a, toward the relay lens 124b. The reflection mirror 125b reflects blue light B, which is emitted from the relay lens 124b, toward the liquid crystal light valve 117.

The cross dichroic prism 119 is a color synthesis optical system in which two dichroic films 119a and 119b are perpendicularly arranged in an X-shape. The dichroic film 119a is a film which reflects blue light B and causes green light G to pass therethrough, and the dichroic film 119b is a film which reflects red light R and causes green light G to pass therethrough. Accordingly, the cross dichroic prism 119 synthesizes red light R, green light G, and blue light B which are modulated in respective liquid crystal light valves 115 to 117, and emits synthesized light toward the projection optical system 118.

Meanwhile, light which is emitted to the cross dichroic prism 119 from the liquid crystal light valves 115 and 117 is s-polarized light, and light which is emitted to the cross dichroic prism 119 from the liquid crystal light valve 116 is p-polarized light. As above, when light which is emitted to the cross dichroic prism 119 is converted into different types of polarized light, it is possible to synthesize light which is emitted from each of the liquid crystal light valves 115 to 117 in the cross dichroic prism 119. Here, generally, the dichroic films 119a and 119b are excellent in the reflectance properties of s-polarized light. Therefore, it is assumed that red light R and blue light B which are reflected in the dichroic films 119a and 119b are s-polarized light and green light G which passes through the dichroic films 119a and 119b is p-polarized light. The projection optical system 118 includes projection lenses (not shown in the drawing), and projects light which is synthesized in the cross dichroic prism 119 on to a projection member such as the screen 111.

Other Projection-Type Display Apparatuses

In the projection-type display apparatus, the transmission-type electro-optical device 100 is used. However, the projection-type display apparatus may be configured using a reflection-type electro-optical device 100. In addition, in the projection-type display apparatus, configuration may be made such that an LED light source, which emits light of the respective colors, or the like is used as the light source section and light of the respective colors emitted from the LED light source is supplied to another liquid crystal apparatus.

Other Electronic Apparatus

The electro-optical device 100 to which the invention is applied may be used as a direct viewing type display apparatus in an electronic apparatus, such as a mobile phone, a portable information terminal (Personal Digital Assistants (PDA)), a digital camera, a liquid crystal television, a car navigation apparatus, a video phone, a POS terminal, and an apparatus which includes a touch panel, in addition to the electronic apparatus.

This application claims priority to Japan Patent Application No. 2015-003203 filed Jun. 25, 2015, the entire disclosure of which is hereby incorporated by reference in its entirety.

What is claimed is:

1. An electro-optical device comprising:
a substrate;
a projection portion that protrudes on a side opposite to the substrate on one surface side of the substrate;
a first electrode that includes a part which overlaps a tip end surface of the projection portion;
a pixel transistor between the substrate and the first electrode;
a first insulation film that is formed on a side of the first electrode that is opposite to the substrate and that includes a flat surface on a side of the first insulation film that is opposite to the substrate;
a second insulation film that is formed to have a film thickness thinner than a height of the projection portion on a side of the first insulation film that is opposite to the substrate; and
a second electrode that is formed on a side of the second insulation film that is opposite to the substrate;
wherein the first electrode is electrically conducted to the second electrode at a part, which overlaps the tip end surface of the projection portion in planar view, through a part at which the first insulation film and the second insulation film are open,
wherein the second electrode is a pixel electrode, and the first electrode is a relay electrode which is electrically connected to the pixel transistor, and
wherein the pixel electrode includes at least
a first transparent conductive film, which is laminated on the side of the second insulation film that is opposite to the substrate, and
a refractive index adjusting dielectric film, which is laminated on a side of the first transparent conductive film that is opposite to the substrate.

2. The electro-optical device according to claim 1, wherein the second insulation film includes boron-doped silicate glass.

3. The electro-optical device according to claim 1, further comprising:
wherein the pixel electrode further includes a second transparent conductive film, which is laminated on a side of the refractive index adjusting dielectric film that is opposite to the substrate.

4. The electro-optical device according to claim 3, further comprising:
a light shading layer that is provided between the substrate and the pixel electrode and is configured to define a transparent area of the pixel electrode,
wherein the pixel electrode includes a connection section that electrically connects the first transparent conductive film to the second transparent conductive film in a location which overlaps the light shading layer in a planar view.

5. The electro-optical device according to claim 4,
wherein the connection section is a part at which the first transparent conductive film and the second transparent conductive film project from an end portion of the refractive index adjusting dielectric film and come into contact with each other.

6. The electro-optical device according to claim 5,
wherein the first transparent conductive film and the second transparent conductive film are provided to be the same shape.

7. The electro-optical device according to claim 5,
wherein the connection section is provided to surround the periphery of the refractive index adjusting dielectric film.

8. An electronic apparatus comprising the electro-optical device according to claim 1.

9. The electronic apparatus according to claim 8, comprising:
a light source section that emits illumination light which is irradiated into the electro-optical device; and
a projection optical system that projects light which is modulated by the electro-optical device.

\* \* \* \* \*